United States Patent
Arao et al.

(10) Patent No.: US 6,720,577 B2
(45) Date of Patent: Apr. 13, 2004

(54) SEMICONDUCTOR DEVICE AND METHOD OF MANUFACTURING THE SAME

(75) Inventors: Tatsuya Arao, Kanagawa (JP); Atsuo Isobe, Kanagawa (JP); Toru Takayama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/943,965

(22) Filed: Aug. 31, 2001

(65) Prior Publication Data

US 2002/0027247 A1 Mar. 7, 2002

(30) Foreign Application Priority Data

Sep. 6, 2000 (JP) ........................................ 2000-269797

(51) Int. Cl.[7] ...................... H01L 29/04; H01L 31/36; H01L 31/376
(52) U.S. Cl. ........................ 257/59; 257/72; 257/532
(58) Field of Search .................. 257/57, 59, 61, 257/66, 72, 532, 534; 438/48, 128, 149, 151, 157, 283, 255, 398, 665, 964, 957; 349/39, 42, 43, 47, 139

(56) References Cited

U.S. PATENT DOCUMENTS

| | | | | |
|---|---|---|---|---|
| 3,895,272 A | * | 7/1975 | Smolko et al. | 361/765 |
| 5,162,933 A | | 11/1992 | Kakuda et al. | 359/59 |
| 5,430,320 A | | 7/1995 | Lee | 257/412 |
| 5,503,731 A | | 4/1996 | Konuma et al. | 205/98 |
| 5,724,107 A | * | 3/1998 | Nishikawa et al. | 349/38 |
| 6,274,887 B1 | * | 8/2001 | Yamazaki et al. | 257/72 |

FOREIGN PATENT DOCUMENTS

JP   2000208777 A  *  7/2000 ......... H01L/29/786

* cited by examiner

*Primary Examiner*—Shouxiang Hu
(74) *Attorney, Agent, or Firm*—Cook, Alex, McFarron, Manzo, Cummings & Mehler, Ltd.

(57) ABSTRACT

In a semiconductor device having a substrate which has a metal surface, an insulating film which is formed on the substrate having the metal surface, and a pixel unit which is formed on the insulating film; the pixel unit includes a TFT, and wiring lines connected with the TFT, and a storage capacitor is constituted by the substrate (11) having the metal surface, the insulating film (12), and the wiring line (21). As the insulating film is thinner, and as the area of a region where the insulating film and the wiring line lie in contact is larger, the storage capacitor is endowed with a larger capacity.

38 Claims, 13 Drawing Sheets

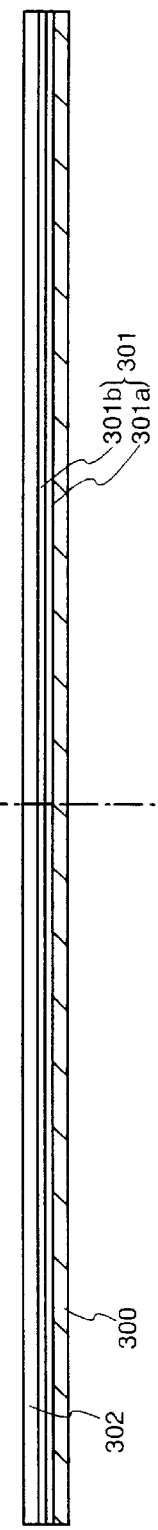
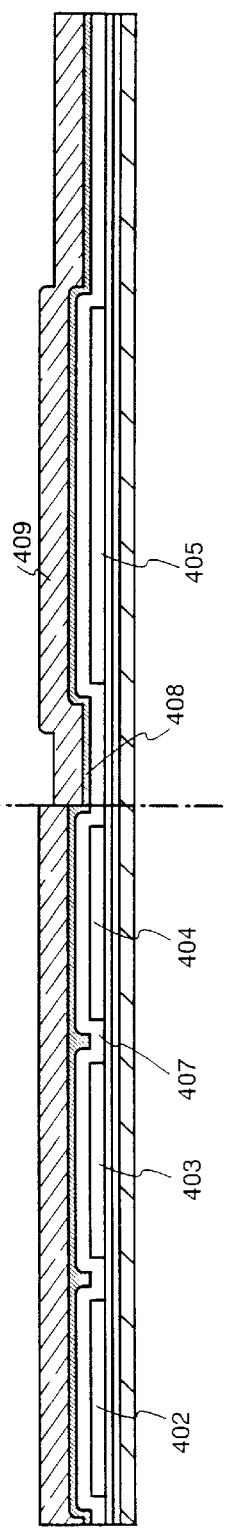
Fig. 2A
Fig. 2B

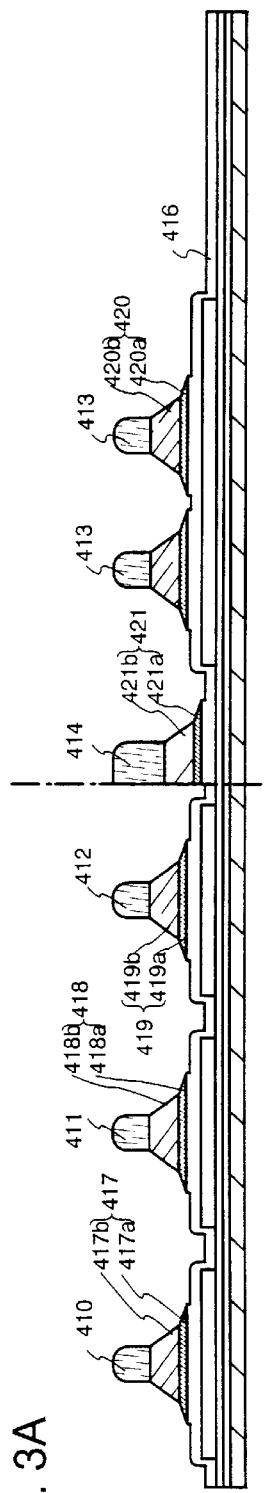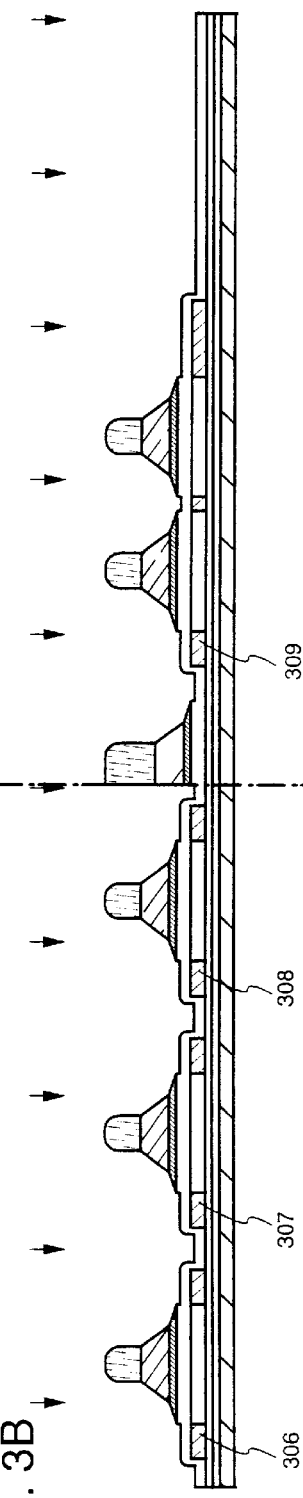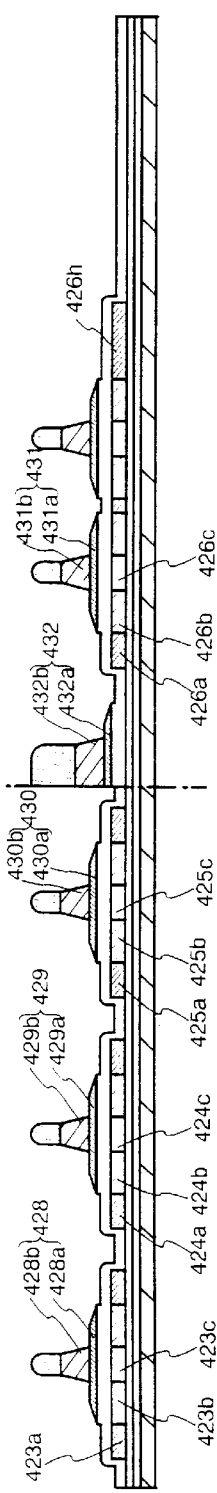

SEMICONDUCTOR DEVICE AND METHOD OF MANUFACTURING THE SAME

BACKGROUND OF THE INVENTION

1. Field of the Invention

The present invention relates to a semiconductor device having a circuit which includes thin film transistors (hereinbelow, abbreviated to "TFTs"), and a method of manufacturing the semiconductor device. More particularly, it relates to, for example, an electro-optical device which is represented by a liquid-crystal display panel, and an electronic equipment on which such an electro-optical device is installed as a component.

Incidentally, here in the specification, the expression "semiconductor device" is intended to signify general devices which function by utilizing semiconductor properties, and it shall cover all of electro-optical devices, semiconductor circuits and electronic equipment.

2. Description of the Related Art

Thin film transistors (hereinbelow, abbreviated to "TFTs") can be formed on a transparent substrate, and the developments of their applications to an active matrix type liquid-crystal display (hereinbelow, termed "AM-LCD") have therefore been positively fostered. Since the TFTs utilizing a crystalline semiconductor film (typically, a crystalline silicon film) can attain a high mobility, it is permitted to present an image display of high definition by integrating functional circuits on an identical substrate.

In recent years, note has been taken of technology which constructs TFTs by the use of a semiconductor thin film (whose thickness is on the order of several—several hundred nm) formed on a substrate having an insulating surface. The TFTs have been extensively applied to ICs and electron devices such as an electro-optical device, and the development thereof has been expedited especially as the switching elements of an image display device.

Although various applications utilizing such an image display device have been expected, applications to portable equipment have been especially noticed. Attempts have therefore been made to form TFT elements on a plastics film having a flexibility.

Since, however, the heat resistance of the plastics film is low, the highest temperature of a manufacturing process is inevitably set low. As a result, it is the present situation that TFTs of favorable electric characteristics as in the case of forming them on a glass substrate cannot be formed. Therefore, a liquid-crystal display device of high performance employing the plastics film has not been realized yet.

Besides, the AM-LCD is basically constructed so that a pixel unit for displaying an image, a gate driver circuit for driving the TFTs of individual pixels arrayed in the pixel unit, and a source driver circuit (or a data driver circuit) for transferring image signals to the respective TFTs are formed on the identical substrate.

There has recently been proposed a system-on-panel wherein, not only the pixel unit and the driver circuits, but also signal processing circuits such as a signal dividing circuit and a γ correction circuit are disposed on the identical substrate.

SUMMARY OF THE INVENTION

The present invention has been made in view of the above points, and has for its object to provide an inexpensive electro-optical device. Another object of the invention is to provide an inexpensive electro-optical device which is made light in weight by employing a flexible thin substrate and forming thin film transistors on the substrate. Still another object of the invention is to provide an inexpensive electronic equipment which includes the electro-optical device as a display unit.

Further, according to the invention, improvements are made on a pixel unit. Concretely, it is also an object of the present invention to provide an electro-optical device of excellent contrast by forming a storage capacitor which can ensure a large capacity without lowering an aperture ratio.

The invention is characterized in that a substrate having a metal surface is employed as an element forming substrate (a substrate on which elements such as TFTs are formed), and that the necessary elements are formed on the substrate having the metal surface, whereby an electro-optical device is obtained. On condition that the substrate having the metal surface is thin, a semiconductor device represented by the electro-optical device, having a flexibility and being lighter in weight can be obtained.

Incidentally, the expression "necessary elements" signifies semiconductor elements (typically, TFTs) for use as the switching elements of pixels in case of an electro-optical device of active matrix type.

Besides, the invention is characterized in that a storage capacitor in a pixel unit is formed of a dielectric as which an insulating film on the substrate having the metal surface is utilized, the substrate which has the metal surface, and a drain wiring line which is connected to a semiconductor layer constituting the pixel TFT.

Concretely, according to the present invention, a semiconductor device having a substrate which has a metal surface, an insulating film which is formed on the substrate having the metal surface, and a pixel unit which is formed on the insulating film, is characterized in that said pixel unit includes a TFT, and wiring lines connected to the TFT; and that a storage capacitor is constituted by said substrate having said metal surface, said insulating film, and the wiring line.

In the above construction, the semiconductor device is characterized in that the substrate having the metal surface (called "metal substrate" in this specification) is a stainless steel substrate, or a substrate whose surface is coated with a metal element.

Also, in the above construction, the semiconductor device is characterized in that the substrate having the metal surface is a heat-resisting metal substrate. Besides, the semiconductor device is characterized in that the maximum height ($R_{MAX}$) of the surface roughness of the substrate is 1 μm or less. Further, the semiconductor device is characterized in that the radius of curvature of a convex part which exists in the surface of the substrate having the metal surface is 1 μm or more.

Besides, in the above construction, the semiconductor device is characterized in that the thickness of the stainless steel substrate is 10 μm–30 μm.

In the above construction, the semiconductor device is characterized in that the insulating film desirably contains silicon, and that the thickness of the insulating film is 50 nm–500 nm (preferably, 50 nm–300 nm).

Further, in the above construction, the semiconductor device is characterized in that the storage capacitor is formed of the metal substrate, the insulating film, and the wiring line which is connected to a semiconductor layer constituting the pixel TFT.

Still further, in the above construction, the semiconductor device is characterized in that the wiring line is formed in contact with the insulating film and is connected to a pixel electrode.

Meanwhile, a method of manufacturing the above semiconductor device according to the invention is characterized by comprising the step of forming a first insulating film on a substrate which has a metal surface: the step of forming a semiconductor layer on said first insulating film; the step of forming a second insulating film on said semiconductor layer; the step of forming a gate electrode on said second insulating film; the step of forming a third insulating film so as to cover said semiconductor layer and said gate electrode; the step of partly removing said third insulating film, thereby to expose part of said semiconductor layer and part of said first insulating film; and the step of forming a wiring line which is electrically connected to said semiconductor layer, and which lies in contact with said part of said first insulating film.

In the above construction, the manufacturing method is characterized in that the wiring line is formed in connection with the parts of the semiconductor layer and the first insulating film.

Also, in the above construction, the manufacturing method is characterized in that a storage capacitor constituting a pixel unit is formed of the metal substrate, the part of the first insulating film, and the wiring line.

Besides, in the above construction, as the first insulating film is thinner, the capacity of the storage capacitor can be enlarged more. Moreover, in a case where the contact area between the first insulating film and the wiring line is larger, the capacity can be enlarged more.

BRIEF DESCRIPTION OF THE DRAWINGS

FIGS. 2A and 2B are sectional views showing the fabricating steps of a pixel TFT, and the TFTs of a driver circuit;

FIGS. 3A through 3C are sectional views showing the fabricating steps of the pixel TFT, and the TFTs of the driver circuit;

FIG. 10A is a top view of the EL display device, while

PREFERRED EMBODIMENTS OF THE INVENTION

An aspect of performance of the present invention will now be described with reference to FIGS. 1A through 1F. These figures show sectional views for explaining the manufacturing steps of a pixel TFT and a storage capacitor. Here, the TFT of single-gate structure is manufactured as the pixel TFT. Of course, the pixel TFT is not restricted to the single-gate structure, but it may well have a double-gate structure, a triple-gate structure or the like.

First, a metal substrate 11 to serve as an element forming substrate is prepared. By way of example, a substrate of stainless steel such as "SUS304" or "SUS316", or a substrate formed with a conductive film can be employed as the metal substrate 11. Typically, the conductive film may be a silicon film having a conductivity (for example, a phosphorus-doped silicon film or a boron-doped silicon film) or a metal film (for example, a tungsten film, a tantalum film, a molybdenum film or a titanium film), or it may well be a silicide film formed by siliciding the metal film or a nitride film formed by nitriding the metal film (such as tantalum nitride film, tungsten nitride film or titanium nitride film). Moreover, such films may well be combined at will and stacked into the conductive film.

Besides, regarding the unevenness of a metal surface in the metal substrate 11, the metal surface should preferably be flattened to a roughness of 1 $\mu$mR$_{MAX}$ or below. Alternatively, the surface roughness per square mm of the metal surface in the metal substrate 11 should preferably be 1 $\mu$m. Further, the convex part of the unevenness of the metal surface needs to have a radius of curvature of at least 1 $\mu$m, preferably at least 10 $\mu$m. It is also allowed to employ a known technique for enhancing the flatness of the metal surface in the metal substrate 11, for example, a polishing process called "CMP (chemical mechanical polishing)".

Subsequently, an insulating base film 12 is formed on the metal substrate 11. The insulating base film 12 functions also as the dielectric (first dielectric) of the storage capacitor in a pixel unit. On this occasion, the use of a thinner insulating film is advantageous because a larger capacity is attained.

The insulating base film 12 is overlaid with a semiconductor layer (not shown) to become the active region of a driver TFT, and a semiconductor layer 13 to become the active region of the pixel TFT.

Besides, a gate insulating film 14 is formed covering the semiconductor layer 13. Typically, the thickness of the gate insulating film 14 may be set at 5 nm–150 nm (preferably, 10 nm–200 nm).

Figure 1A:
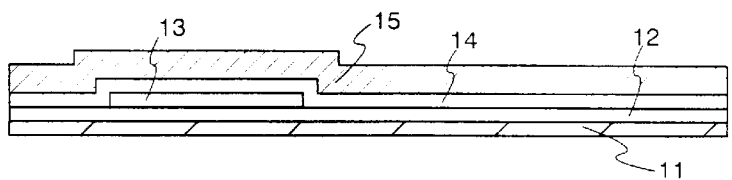
FIGS. 1A through 1F are sectional views showing an example of a method of manufacturing a pixel TFT and a storage capacitor according to the present invention.

Subsequently, a conductive film 15 is formed on the gate insulating film 14. Here, the conductive film 15 is formed of a conductive film having a heat resistance which is high enough to endure temperatures of 800° C.–1150° C. (preferably, 900° C.–1100° C.) (FIG. 1A).

Typically, the conductive film 15 may be a silicon film having a conductivity (for example, a phosphorus-doped silicon film or a boron-doped silicon film) or a metal film (for example, a tungsten film, a tantalum film, a molybdenum film or a titanium film), or it may well be a silicide film formed by siliciding the metal film or a nitride film formed by nitriding the metal film (such as tantalum nitride film, tungsten nitride film or titanium nitride film). Moreover, such films may well be combined at will and stacked into the conductive film 15.

Besides, in case of employing the metal film, a multilayer structure with a silicon film is desirable for preventing the oxidation of the metal film. Also, a structure in which the metal film is covered with an insulating film containing silicon is effective in the sense of antioxidation. A silicon oxide film, a silicon nitride film or a silicon oxynitride film (also termed "silicon nitroxide film") can be employed as the insulating film which contains silicon. Incidentally, the "silicon oxynitride film" is an insulating film which contains oxygen, nitrogen and silicon in a predetermined proportion.

By the way, when the conductive film 15 is formed of the above materials, a gate wiring pattern can also be formed in such a way that the insulating film containing silicon is disposed at the uppermost layer during the film formation, and that it is etched together with the metal film. In this case, the resulting structure falls into a state where only the upper surface of a gate wiring line is protected by the insulating film containing silicon.

Subsequently, a gate electrode 16 is formed by patterning. By the way, in this specification, the word "electrode" signifies that part of a wiring line which is electrically connected with another wiring line or which intersects with a semiconductor layer. Accordingly, the expressions "wiring line" and "electrode" will be separately used for the sake of description, but the "electrode" shall be always implied in the expression "wiring line".

Figure 1B:
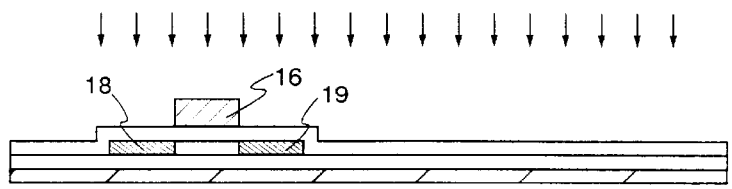

Subsequently, a doping process is performed to dope the semiconductor layer 13 with an impurity element (FIG. 1B). The doping process may be carried out by ion doping or ion implantation. The conditions of the ion doping are set at a dose of $1 \times 10^{13} - 5 \times 10^{15}/cm^2$ and an acceleration voltage of 5–100 keV. In this case, the conductive layer 16 serves as a mask against the impurity element, and impurity regions 18, 19 are formed in self-alignment manner.

Incidentally, before the doping process, the semiconductor layer 13 may well be partly exposed in such a way that the gate insulating film 14 is partly etched using the gate electrode 16 as a mask. Thus, it is facilitated to dope the semiconductor film 13 with the impurity element, and the quantity of the doping may be smaller.

Further, the impurity element is activated by a heat treatment. The heat treatment is carried out by thermal annealing with an annealing furnace, rapid thermal annealing (RTA) or laser annealing.

Figure 1C:
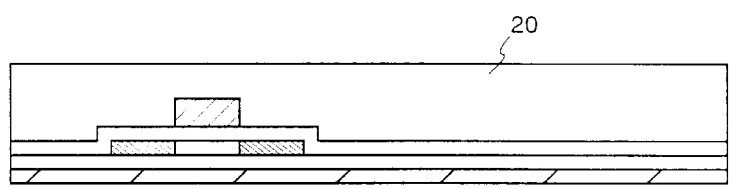

Subsequently, a first interlayer insulating film 20 is formed of a silicon nitride film, a silicon nitroxide film or a silicon oxide film which is fabricated by a known method (such as thermal CVD, plasma CVD, evaporation, sputtering or lowered-pressure thermal CVD) (FIG. 1C).

Subsequently, contact holes which reach a source region and a drain region are formed using a known technique. Simultaneously, in the pixel unit, the base film 12 is partly exposed in such a way that the first interlayer insulating film 20 and the gate insulating film 14 are etched in a region which is surrounded with a source wiring line and a drain wiring line to be formed by a later step and which does not overlap the semiconductor layer 13 of the pixel TFT. On this occasion, the area of the region in which the base film 12 is exposed can be properly determined. The larger area of the exposed base film 12 is advantageous for the reason that a wiring line of larger area can be formed, so the storage capacitor constituted by the metal substrate 11, base film 12 and drain wiring line can attain a larger capacity. Further, it is advantageous for the attainment of the larger capacity of the storage capacitor that, in etching the first interlayer insulating film 20 and the gate insulating film 14, the base film 12 is simultaneously etched to become thinner.

Figure 1D:
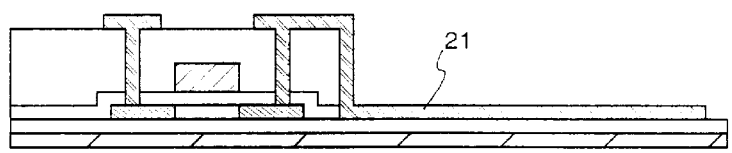

At the next step, the source wiring line and the drain wiring line 21 are formed to fabricate the TFT. Here, the drain wiring line 21 of the pixel TFT is formed so as to connect the drain region and the exposed part of the base film 12 (FIG. 1D).

Subsequently, using a known technique, a hydrogenation process is performed so as to hydrogenate the whole structure, whereby the TFT is finished up. In an example, the hydrogenation process employed a hydrogen plasma permitting the process at a comparatively low temperature.

Figure 1E:
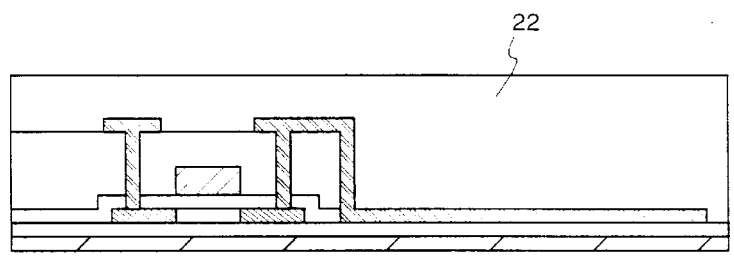
Figure 1F:
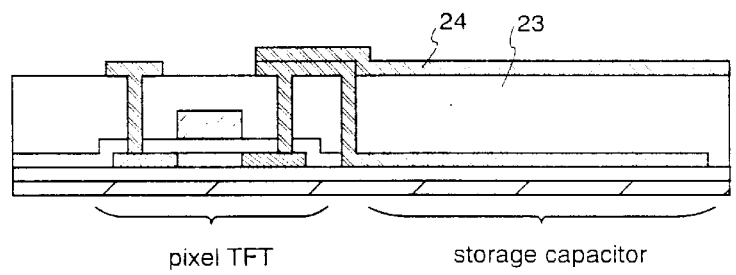

At the next step, a second interlayer insulating film 22 is formed (FIG. 1E). A resin film of low relative permittivity is favorable as the second interlayer insulating film 22. Usable as the resin film is a polyimide film, an acrylic resin film, a polyamide film, a BCB (benzocyclobutene) film or the like. It is also allowed to employ a flattening film. Thereafter, the second interlayer insulating film 22 is etched-back into one 23 so as to partly expose the drain wiring line 21, and a pixel electrode 24 is formed in connection with the drain wiring line 21 of the pixel TFT (FIG. 1F). A metal film of high reflectivity, represented by an aluminum film, may be employed as the pixel electrode 24 in case of manufacturing an AM-LCD of reflection type.

As described above, in FIGS. 1A–1F, the storage capacitor associated with the pixel TFT is formed of the substrate 11 having the metal surface, the base film 12, and the drain wiring line 21 of the pixel TFT. By the way, it is preferable to keep a potential of the substrate 11 having the metal surface constant.

Since the present invention employs the substrate having the metal surface, it cannot be applied to an electro-optical device of transmission type. The storage capacitor, however, can be formed at the maximum area by the use of the region which is surrounded with the gate wiring line and the source wiring line and which does not overlap the pixel TFT, so that the storage capacitor of very large capacity can be effectively realized. Moreover, when the insulating base film functioning as the dielectric is thinned, the capacity of the storage capacitor can be increased more.

The present invention of the above construction will be described in more detail in conjunction with embodiments below.

[Embodiment 1]

This embodiment will now be described with reference to FIGS. 1A–1F. These figures show sectional views for explaining the manufacturing steps of a pixel TFT and a storage capacitor. Here, the TFT of single-gate structure is manufactured as the pixel TFT. Of course, the pixel TFT is not restricted to the single-gate structure, but it may well have a double-gate structure, a triple-gate structure or the like. Also, it is needless to say that the invention is not restricted to this embodiment.

First, a metal substrate 11 to serve as an element forming substrate is prepared. In a case where a stainless steel substrate having a thickness of 10 μm–30 μm is employed for the purpose of a lighter weight, transportation etc. are hampered in operating an apparatus for a glass substrate or a synthetic quartz substrate, because the stainless steel substrate has a flexibility. Therefore, the stainless steel substrate is adapted to the apparatus by, for example, preparing a substrate holder and fixing the stainless steel substrate to the substrate holder.

Besides, regarding the unevenness of a metal surface in the metal substrate 11, the surface roughness per square mm of the metal surface under the condition of 1 μmR$_{MAX}$ should preferably be 1 μm. Further, the convex part of the unevenness of the metal surface is set at a radius of curvature of at least 1 μm, preferably at least 10 μm. It is also allowed to employ a known technique for enhancing the flatness of the metal surface in the metal substrate 11, for example, a polishing process called "CMP (chemical mechanical polishing)".

Subsequently, an insulating base film 12 is formed on the metal substrate 11. The insulating base film 12 functions also as the dielectric (first dielectric) of the storage capacitor in a pixel unit. On this occasion, the use of a thinner insulating film is advantageous because a larger capacity is attained. The insulating base film 12 can be formed of a silicon oxide film, a silicon nitride film, a silicon nitroxide film ($SiO_xN_y$), a multilayer film including such films, or the like, within a thickness range of 50 nm–500 nm. It is formed by a known method of film formation (such as thermal CVD, plasma CVD, evaporation, sputtering or lowered-pressure thermal CVD). In an example, a silicon oxynitride film containing the nitrogen element more than the oxygen element in its film composition was formed to a thickness of 150 nm.

The insulating base film 12 is overlaid with a semiconductor film by a known method such as plasma CVD or sputtering, to a thickness of 10 nm–200 nm (preferably, 30 nm–100 nm). Incidentally, an amorphous semiconductor film, a micro-crystal semiconductor film, or the like is included as the semiconductor film, and a compound semiconductor film having an amorphous structure, such as amorphous silicon germanium film may well be applied. A known method of film formation (such as thermal CVD, plasma CVD, evaporation, sputtering, or lowered-pressure thermal CVD) can be employed as a method of forming the semiconductor film, and also a known method (such as solid-phase growth, laser crystallization, or solid-phase growth utilizing a catalytic element) can be employed as a method of crystallization. In an example, an amorphous silicon film was formed by the sputtering permitting the film formation at a low temperature, and a crystalline silicon film was formed by the laser crystallization. In the case of fabricating the crystalline semiconductor film by the laser crystallization, an excimer laser of pulse oscillation type or continuous emission type, a YAG laser, or a $YVO_4$ laser can be employed. At the next step, the semiconductor film is etched into a semiconductor layer 13 of desired shape.

Besides, a gate insulating film 14 is formed covering the semiconductor layer 13, by plasma CVD or sputtering. Typically, the thickness of the gate insulating film 14 may be set at 5 nm–150 nm (preferably, 10 nm–200 nm). In an example, a silicon oxynitride film (at a composition ratio of Si=32%, O=59%, N=7% and H=2%) was formed by the plasma CVD to a thickness of 110 nm. Of course, the gate insulating film 14 is not restricted to the silicon oxynitride film, but another insulating film containing silicon may well be employed as a single-layer or multilayer structure.

Subsequently, a conductive film 15 is formed on the gate insulating film 14. Here, the conductive film 15 is formed of a conductive film having a heat resistance which is high enough to endure temperatures of 800° C.–1150° C. (preferably, 900° C.–1100° C.) (FIG. 1A).

Typically, the conductive film 15 may be a silicon film having a conductivity (for example, a phosphorus-doped silicon film or a boron-doped silicon film) or a metal film (for example, a tungsten film, a tantalum film, a molybdenum film or a titanium film), or it may well be a silicide film formed by siliciding the metal film or a nitride film formed by nitriding the metal film (such as tantalum nitride film, tungsten nitride film or titanium nitride film). Moreover, such films may well be combined at will and stacked into the conductive film 15.

Besides, in case of employing the metal film, a multilayer structure with a silicon film is desirable for preventing the oxidation of the metal film. Also, a structure in which the metal film is covered with an insulating film containing silicon is effective in the sense of antioxidation. A silicon oxide film, a silicon nitride film or a silicon oxynitride film (also termed "silicon nitroxide film") can be employed as the insulating film which contains silicon. Incidentally, the "silicon oxynitride film" is an insulating film which contains oxygen, nitrogen and silicon in a predetermined proportion.

By the way, when the conductive film 15 is formed of the above materials, a gate wiring pattern can also be formed in such a way that the insulating film containing silicon is disposed at the uppermost layer during the film formation, and that it is etched together with the metal film. In this case, the resulting structure falls into a state where only the upper surface of a gate wiring line is protected by the insulating film containing silicon. In an example, the conductive film 15 was made of a TaN film which was 30 nm thick. The TaN film was formed by sputtering which employed a target of Ta and which was performed in an atmosphere containing nitrogen.

At the next step, a gate electrode 16 is formed by patterning.

Subsequently, a doping process is performed to dope the semiconductor layer 13 with an impurity element (FIG. 1B). The doping process may be carried out by ion doping or ion implantation. The conditions of the ion doping are set at a dose of $1\times10^{13}$–$5\times10^{15}$/cm$^2$ and an acceleration voltage of 5–100 keV. In this case, the conductive layer 16 serves as a mask against the impurity element, and impurity regions 18, 19 are formed in self-alignment manner. In an example, the doping process was such that the semiconductor layer 13 is doped with phosphorus (P) as the impurity element bestowing the n-type, and that the phosphorus concentration of the impurity regions 18, 19 was $1\times10^{20}$–$5\times10^{21}$/cm$^3$. Here, since an n-channel TFT is employed as the pixel TFT, only the doping process for the impurity element bestowing the n-type is illustrated, but a p-channel TFT is also fabricated in a driver circuit. In case of doping with an impurity element bestowing the p-type, the semiconductor layer 13 for forming the n-channel TFT is covered with a mask which is made of a resist.

Further, the impurity element is activated by a heat treatment. The heat treatment is carried out by thermal annealing with an annealing furnace, rapid thermal annealing (RTA) or laser annealing. In an example, the heat treatment was carried out at a temperature of 550° C. for 4 hours.

Subsequently, a first interlayer insulating film 20 is formed of a silicon nitride film, a silicon nitroxide film or a silicon oxide film which is fabricated by a known method (such as thermal CVD, plasma CVD, evaporation, sputtering or lowered-pressure thermal CVD) (FIG. 1C). In an example, an acrylic resin film having a thickness of 1.6 μm was formed, and it had a viscosity of 10 cp–1000 cp, preferably 40 cp–200 cp.

Subsequently, contact holes which reach a source region and a drain region are formed using a known technique. Simultaneously, in the pixel unit, the base film 12 is partly exposed in such a way that the first interlayer insulating film 20 and the gate insulating film 14 are etched in a region which is surrounded with a source wiring line and a drain wiring line to be formed by a later step and which does not overlap the semiconductor layer 13 of the pixel TFT. On this occasion, the area of the region in which the base film 12 is exposed can be properly determined. The larger area of the exposed base film 12 is advantageous for the reason that a wiring line of larger area can be formed, so the storage capacitor constituted by the metal substrate 11, base film 12 and drain wiring line can attain a larger capacity. Further, it is advantageous for the attainment of the larger capacity of the storage capacitor that, in etching the first interlayer insulating film 20 and the gate insulating film 14, the base film 12 is simultaneously etched to become thinner.

At the next step, the source wiring line and the drain wiring line 21 are formed to fabricate the TFT. Here, the drain wiring line 21 of the pixel TFT is formed so as to connect the drain region and the exposed part of the base film 12 (FIG. 1D).

Subsequently, using a known technique, a hydrogenation process is performed so as to hydrogenate the whole structure, whereby the TFT is finished up. In an example, the hydrogenation process employed a hydrogen plasma permitting the process at a comparatively low temperature.

At the next step, a second interlayer insulating film 22 is formed (FIG. 1E). A resin film of low relative permittivity is favorable as the second interlayer insulating film 22. Usable as the resin film is a polyimide film, an acrylic resin film, a polyamide film, a BCB (benzocyclobutene) film or the like. It is also allowed to employ a flattening film. Thereafter, the second interlayer insulating film 22 is etched-back into one 23 so as to partly expose the drain wiring line 21, and a pixel electrode 24 is formed in connection with the drain wiring line 21 of the pixel TFT (FIG. 1F). A metal film of high reflectivity, represented by an aluminum film, may be employed as the pixel electrode 24 in case of manufacturing an AM-LCD of reflection type.

As described above, in FIGS. 1A–1F, the storage capacitor associated with the pixel TFT is formed of the substrate 11 having the metal surface, the base film 12, and the drain wiring line 21 of the pixel TFT.

Since the present invention employs the substrate having the metal surface, it cannot be applied to an electro-optical device of transmission type. The storage capacitor, however, can be formed at the maximum area by the use of the region which is surrounded with the gate wiring line and the source wiring line and which does not overlap the pixel TFT, so that the storage capacitor of very large capacity can be effectively realized. Moreover, when the base film functioning as the dielectric is thinned, the capacity of the storage capacitor can be increased more.

[Embodiment 2]

In this embodiment, a method of fabricating an active matrix substrate will be described with reference to FIG. 2A–FIG. 7.

First, a substrate 300 having a metal surface is employed in this embodiment. Incidentally, a stainless steel substrate, or a glass substrate on which a conductive film is formed may well be employed as the substrate 300.

Besides, regarding the unevenness of the metal surface in the metal substrate 300, the metal surface should preferably be flattened to a roughness of 1 $\mu m R_{MAX}$ or below. Alternatively, the surface roughness per square mm of the metal surface in the metal substrate 300 should preferably be 1 $\mu$m. Further, the convex part of the unevenness of the metal surface needs to have a radius of curvature of at least 1 $\mu$m, preferably at least 10 $\mu$m. It is also allowed to employ a known technique for enhancing the flatness of the metal surface in the metal substrate 300, for example, a polishing process called "CMP (chemical mechanical polishing)".

Subsequently, a base film 301 which is made of an insulating film, such as silicon oxide film, silicon nitride film or silicon oxynitride film, is formed on the substrate 300.

Although a double-layer structure is employed for the base film 301 in this embodiment, a single-layer film of the insulating film or a multilayer structure consisting of at least two layers of such insulating films may well be employed. As the first layer of the base film 301, a silicon oxynitride film 301a is formed to a thickness of 10 nm–200 nm (preferably, 50 nm–100 nm) by plasma CVD which employs $SiH_4$, $NH_3$ and $N_2O$ as reaction gases. In an example, the silicon oxynitride film 301a (at a composition ratio of Si=32%, O=27%, N=24% and H=17%) having a thickness of 50 nm was formed. Subsequently, as the second layer of the base film 301, a silicon oxynitride film 301b is stacked and formed to a thickness of 50–200 nm (preferably, 100–150 nm) by plasma CVD which employs $SiH_4$ and $N_2O$ as reaction gases. In the example, the silicon oxynitride film 301b (at a composition ratio of Si=32%, O=59%, N=7% and H=2%) having a thickness of 100 nm was formed.

Subsequently, a semiconductor film having an amorphous structure is formed on the base film 301 to a thickness of 25 nm–80 nm (preferably, 30 nm–60 nm) by a known method (such as sputtering, LPCVD, or plasma CVD), whereupon a known crystallization process (such as laser crystallization, thermal crystallization, or thermal crystallization employing nickel or the like catalyst) is performed, thereby to obtain a crystalline semiconductor film 302 (FIG. 2A). Although the material of the semiconductor film is not restricted, it may preferably be silicon, a silicon-germanium (Si—Ge) alloy or the like. In an example, an amorphous silicon film being 55 nm thick was formed by plasma CVD, and a solution containing nickel was thereafter held on the amorphous silicon film. This amorphous silicon film was dehydrogenated (at 500° C. for 1 hour), and was thermally crystallized (at 550° C. for 4 hours). Further, the resulting film was subjected to a laser annealing process for improving the crystallization. Thus, a crystalline silicon film was formed. Besides, the crystalline semiconductor film 302 is formed into semiconductor layers 402–405 by a patterning process which employs photolithography.

In case of fabricating the crystalline semiconductor film 302 by laser crystallization, an excimer laser of pulse oscillation type or continuous emission type, a YAG laser, a $YVO_4$ laser or the like can be employed. In case of employing such a laser, a method is recommended wherein a laser beam emitted from a laser oscillator is condensed into the shape of a line by an optical system so as to irradiate the semiconductor film. The conditions of the crystallization shall be properly chosen by a person who controls the process. In the present invention, however, the metal substrate 300 which has a thermal conductivity higher than that of a glass substrate is employed, and hence, thermal energy based on the irradiation with the laser beam is liable to escape. Therefore, the laser irradiation should preferably be at an energy level which is higher than in case of employing the glass substrate or a synthetic quartz substrate. By way of example, in the case of employing the excimer laser, it is allowed to set a pulse oscillation frequency at 300 Hz and a laser energy density at 100–800 mJ/cm$^2$ (typically, 300–700 mJ/cm$^2$). Besides, in the case of employing the YAG laser, it is allowed to utilize the second higher harmonics of the emitted laser beam and to set a pulse oscillation frequency at 1–300 Hz and a laser energy density at 300–1000 mJ/cm$^2$ (typically, 350–800 mJ/cm$^2$). Herein, the whole surface of the substrate may be irradiated with the laser beam condensed in the shape of the line having a width of 100–1000 $\mu$m, for example, 400 $\mu$m, and the overlap percentage of such rectilinear laser beams on this occasion may be set at 50–98%.

Besides, after the semiconductor layers 402–405 have been formed, they may well be doped with a slight amount of impurity element (boron or phosphorus) in order to control the threshold voltages of TFTs.

Subsequently, a gate insulating film 407 which covers the semiconductor layers 402–405 is formed. The gate insulating film 407 is formed of an insulating film containing silicon, at a thickness of 40 nm–150 nm by employing plasma CVD or sputtering. In an example, the gate insulating film 407 was formed of a silicon oxynitride film (at a composition ratio of Si=32%, O=59%, N=7% and H=2%) at a thickness of 110 nm by the plasma CVD. Of course, the gate insulating film 407 is not restricted to the silicon oxynitride film, but another insulating film containing silicon may well be employed as a single-layer or multilayer structure.

Besides, in case of employing a silicon oxide film, it can be formed by the plasma CVD in such a way that TEOS (TetraEthyl OrthoSilicate) and $O_2$, are mixed, and that electric discharge is induced under the conditions of a reaction pressure of 40 Pa, a substrate temperature of 300° C.–400° C. and a radio-frequency (13.56 MHz) power density of 0.5–0.8 W/cm². The silicon oxide film thus prepared is thereafter subjected to thermal annealing at 400° C.-500° C., whereby characteristics favorable as the gate insulating film can be attained.

Subsequently, as shown in FIG. 2B, a first conductive film 408 having a thickness of 20 nm–100 nm, and a second conductive film 409 having a thickness of 100 nm–400 nm are stacked and formed on the gate insulating film 407. In an example, the first conductive film 408 made of a TaN film having a thickness of 30 nm, and the second conductive film 409 made of a W film having a thickness of 370 nm were stacked and formed. The TaN film was formed by sputtering which employed a target of Ta and which was performed in an atmosphere containing nitrogen. On the other hand, the W film was formed by sputtering which employed a target of W. Alternatively, the W film can be formed by thermal CVD which employs tungsten hexafluoride ($WF_6$). Anyway, the W film needs to be lowered in resistivity for use as gate electrodes, and it should desirably have its resistivity set at 20 $\mu\Omega$cm or less. The W film can have its resistivity lowered by enlarging crystal grains, but it has its crystallization hampered to turn into a high resistivity, in a case where impurity elements such as oxygen are contained in large amounts in this W film. In the example, therefore, the W film was formed by the sputtering which employed a W target of high purity (at a purity of 99.9999%) and which took sufficient care that impurities did not mix from within a gaseous phase during the formation of the film. Thus, the W film exhibiting a resistivity of 9–20 $\mu\Omega$cm could be realized.

By the way, although the first conductive film 408 and the second conductive film 409 were respectively made of TaN and W in the example, they are not especially restrictive, but both the conductive films may well be formed of an element which is selected from the group consisting of Ta, W, Ti, Mo, Al, Cu, Cr and Nd, or an alloy material or compound material which contains the element as its main component. Alternatively, it is allowed to employ a semiconductor film which is typified by a crystalline silicon film doped with an impurity element such as phosphorus. It is also allowed to employ an Ag—Pd—Cu alloy. It is further allowed to employ a combination in which the first conductive film is formed of a tantalum (Ta) film, while the second conductive film is formed of a W film; a combination in which the first conductive film is formed of a titanium nitride (TiN) film, while the second conductive film is formed of a W film; a combination in which the first conductive film is formed of a tantalum nitride (TaN) film, while the second conductive film is formed of an Al film; or a combination in which the first conductive film is formed of a tantalum nitride (TaN) film, while the second conductive film is formed of a Cu film.

Subsequently, masks 410–414 made of a resist are formed by photolithography, and a first etching process for forming the electrodes and wiring lines is performed. The first etching process is carried out under first and second etching conditions. In an example, as the first etching conditions, ICP (Inductively Coupled Plasma) etching was employed, $CF_4$, $Cl_2$ and $O_2$ were used as etching gases, the ratio of the flow rates of the respective gases was set at 25:25:10 (sccm), and a plasma was generated by feeding RF (13.56 MHz) power of 500 W to a coiled electrode under a pressure of 1 Pa. Used here was a dry etching apparatus utilizing ICP (Model E645-□ICP) produced by Matsushita Electric Industrial Co., Ltd. RF (13.56 MHz) power of 150 W was also fed to a substrate side (sample stage), whereby a negative self-bias voltage was, in effect, applied. Owing to the first etching conditions, the W film is etched to bring the end parts of first conductive layers into a tapered shape.

Thereafter, the first etching conditions were switched to the second etching conditions without removing the masks 410–414 made of the resist. More specifically, $CF_4$ and $Cl_2$ were used as etching gases, the ratio of the flow rates of the respective gases was set at 30:30 (sccm), and a plasma was generated by feeding RF (13.56 MHz) power of 500 W to the coiled electrode under a pressure of 1 Pa, whereby etching was carried out for about 30 seconds. RF (13.56 MHz) power of 20 W was also fed to the substrate side (sample stage), whereby a negative self-bias voltage was, in effect, applied. Both the W film and the TaN film are etched substantially equally under the second etching conditions in which the gases $CF_4$ and $Cl_2$ are mixed. By the way, etching time periods may be increased at a rate of about 10%–20% in order to etch the first conductive film 408 and the second conductive film 409 without leaving any residue on the gate insulating film 407.

In the first etching process, when the masks 410–414 made of the resist are appropriately shaped, the end parts of the first conductive layers and second conductive layers are tapered by the effects of the bias voltages applied to the substrate side. The angle of each tapered part becomes 15–45 degrees. In this way, conductive layers 417–421 of the first shape as consist of the first conductive layers and the second conductive layers (first conductive layers 417a-421a, and second conductive layers 417b–421b) are formed by the first etching process. Incidentally, the gate insulating film 407 is turned into one 416 whose regions not covered with the conductive layers 417–421 of the first shape have been etched and thinned about 20 nm–50 nm.

Further, a first doping process is performed without removing the masks 410–414 made of the resist, thereby to dope the semiconductor layers 402–405 with an impurity element which bestows the n-type (FIG. 3B). The doping process may be carried out by ion doping or ion implantation. The conditions of the ion doping are set at a dose of $1\times10^{13}$–$5\times10^{15}$/cm² and an acceleration voltage of 60–100 keV. In an example, the dose was $1.5\times10^{15}$/cm², and the acceleration voltage was 80 keV. An element belonging to Group-15 of the periodic table, typically phosphorus (P) or arsenic (As), is employed as the impurity element for bestowing the n-type, and the element phosphorus (P) was employed here. In this case, the conductive layers 417–421 serve as masks against the n-type impurity element, and first heavily-doped impurity regions 306–309 are formed in self-alignment manner. The first heavily-doped impurity regions 306–309 are doped with the n-type impurity element in a concentration range of $1 \times 10^{20} - 1 \times 10^{21}/cm^3$.

Subsequently, a second etching process is performed without removing the masks 410–414 made of the resist. Here, the W film is selectively etched by employing $CF_4$, $Cl_2$ and $O_2$ as etching gases. On this occasion, second conductive layers 428b–432b are formed by the second etching process. On the other hand, the first conductive layers 417a–421a are hardly etched, so that conductive layers 428–432 of second shape are formed.

Subsequently, as shown in FIG. 3C, a second doping process is performed without removing the masks 410–414 made of the resist. In this case, a dose is lowered as compared with that of the first doping process, and an impurity element bestowing the n-type is introduced at a high acceleration voltage of 70–120 keV. In an example, the dose was $1.5 \times 10^{14}/cm^2$, voltage was 90 keV. Thus, new impurity regions are formed in those parts of the semiconductor layers 402–405 which lie inside the first heavily-doped impurity regions 306–309 formed at the step of FIG. 3B. In the second doping process, using the conductive layers 428–432 of the second shape as masks, the impurity element is also introduced into those parts of the semiconductor layers 402–405 which lie below the second conductive layers 428b–432b. Thus, second heavily-doped impurity regions 423a–426a and lightly-doped impurity regions 423b–426b are formed anew adjacent to channel forming regions 423c–426c, respectively.

Figure 4A:
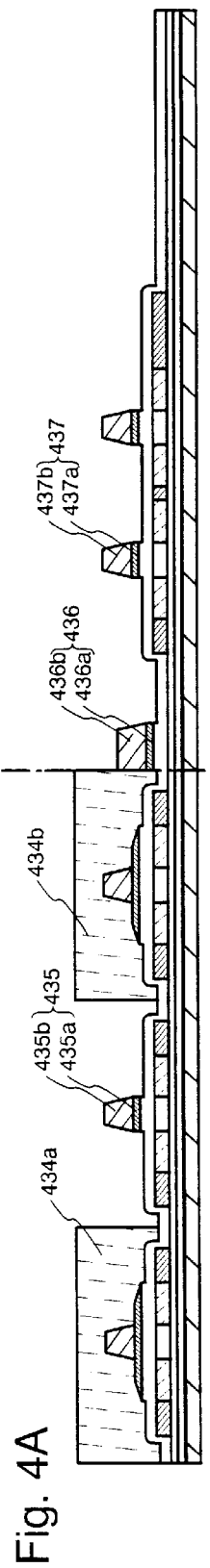
FIGS. 4A through 4C are sectional views showing the fabricating steps of the pixel TFT, and the TFTs of the driver circuit.

Subsequently, the masks 410–414 made of the resist are removed, and masks 434a and 434b made of a resist are formed anew so as to perform a third etching process as shown in FIG. 4A. More specifically, $SF_6$ and $Cl_2$ are used as etching gases, the ratio of the flow rates of the respective gases is set at 50:10 (sccm), and a plasma is generated by feeding RF (13.56 MHz) power of 500 W to the coiled electrode under a pressure of 1.3 Pa, whereby etching is carried out for about 30 seconds. RF (13.56 MHz) power of 10 W is fed to the substrate side (sample stage), whereby a negative self-bias voltage is, in effect, applied. In this way, the parts of the TaN film corresponding to the p-channel TFT and to the TFT of a pixel unit (pixel TFT) are etched by the third etching process, so that conductive layers 435–437 of third shape are formed.

Figure 4B:
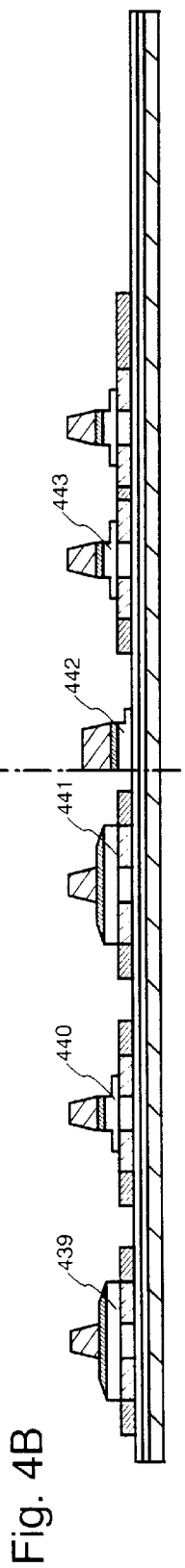

Subsequently, the masks 434a and 434b made of the resist are removed. Thereafter, using the conductive layers 428 and 430 of the second shape and the conductive layers 435–437 of the third shape as masks, the gate insulating film 416 is selectively removed, so that insulating layers 439–443 are formed (FIG. 4B).

Figure 4C:
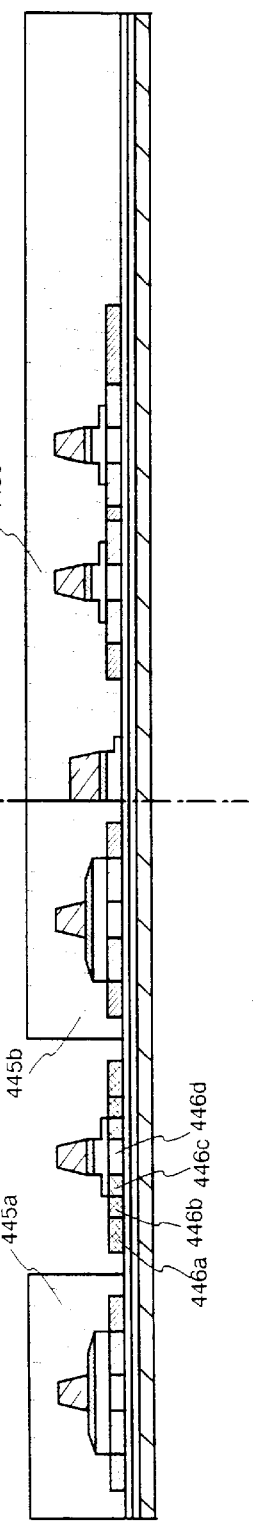

Subsequently, masks 445a–445c made of a resist are formed anew so as to perform a third doping process. Owing to the third doping process, impurity regions 446 doped with an impurity element bestowing the opposite conductivity type to one conductivity type stated before is formed in the semiconductor layer 403 which becomes the active layer of the p-channel TFT. Here the impurity regions 446 are formed in self-alignment manner in such a way that the impurity element bestowing the p-type is introduced by employing the second conductive layer 435a as a mask against the impurity element. In an example, the impurity regions 446 were formed by ion doping which employed diborane ($B_2H_6$) (FIG. 4C). During the third doping process, the semiconductor layers 402, 404 and 405 for forming the n-channel TFTs are covered with the resist masks 445a–445c. The impurity regions 446 have been doped with phosphorus at concentrations different from one another by the first and second doping processes. In this regard, the doping processes are performed so that, in any of the regions 446, the concentration of the impurity element bestowing the p-type may become $2 \times 10^{20} - 2 \times 10^{21}/cm^3$. Accordingly, the impurity regions 446 pose no problem in functioning as the source region and drain region of the p-channel TFT. In this embodiment, the semiconductor layer 403 to become the active layer of the p-channel TFT is partly exposed to bring forth the advantage that the impurity element (boron) is easily introduced.

The impurity regions are formed in the respective semiconductor layers by the steps thus far described.

Subsequently, the masks 445a–445c made of the resist are removed, and a first interlayer insulating film 461 is formed. The first interlayer insulating film 461 is formed of an insulating film containing silicon, at a thickness of 100–200 nm by employing plasma CVD or sputtering. In an example, the first interlayer insulating film 461 was formed of a silicon oxynitride film at a thickness of 150 nm by the plasma CVD. Of course, the first interlayer insulating film 461 is not restricted to the silicon oxynitride film, but another insulating film containing silicon may well be employed as a single-layer or multilayer structure.

Figure 5A:
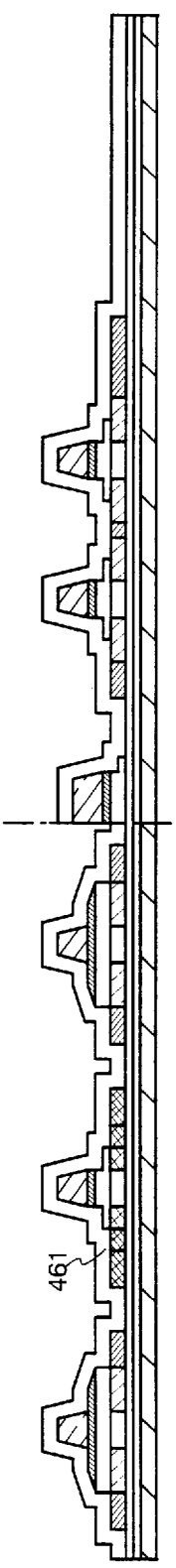
FIGS. 5A through 5C are sectional views showing the fabricating steps of the pixel TFT, and the TFTs of the driver circuit.

Subsequently, the step of activating the impurity elements with which the respective semiconductor layers 402–405 are doped is performed as shown in FIG. 5A. The activating process is performed by thermal annealing which employs an annealing furnace. The thermal annealing may be carried out at a temperature of 400° C.–700° C., typically 500° C.–550° C., in a nitrogen atmosphere whose oxygen concentration is at most 1 ppm, preferably at most 0.1 ppm. In an example, the activation was done by a heat treatment at 550° C. for 4 hours. Incidentally, laser annealing or rapid thermal annealing (RTA) is applicable alternatively to the thermal annealing.

By the way, in this embodiment, simultaneously with the activating process, the element nickel having been used as the catalyst at the crystallizing step crystallizes the impurity regions 423a, 425a, 426a and 446a which contain the element phosphorus at the high concentrations. Therefore, the metal element is gettered in these impurity regions, and the nickel concentrations of the semiconductor layers 402–405 to serve chiefly as the channel forming regions of the TFTs are lowered. The TFTs including the channel forming regions thus fabricated have low OFF currents and exhibit high field-effect mobilities based on good crystallinity, so that they achieve favorable characteristics.

Besides, the activating process may well be performed before the formation of the first interlayer insulating film 461. However, in a case where the material of wiring lines employed is less resistant to heat, the activating process should preferably be performed after the formation of the interlayer insulating film 461 (an insulating film whose principal component is silicon, for example, a silicon nitride film) in order to protect the wiring lines etc. as in this embodiment.

Further, a heat treatment is performed at 300° C.–550° C. for 1–12 hours in an atmosphere containing 3–100% of hydrogen, as the step of hydrogenating the semiconductor layers 402–405. In an example, a heat treatment was carried out at 410° C. for 1 hour in a nitrogen atmosphere containing about 3% of hydrogen. This step is the processing step in which dangling bonds existent in the semiconductor layers 402–405 are terminated with hydrogen contained in the interlayer insulating film 461. Plasma hydrogenation (which employs hydrogen excited by a plasma) may well be performed as another expedient for the hydrogenation.

Besides, in case of employing the laser annealing for the activating process, the above hydrogenation should desirably be followed by irradiation with a laser beam by an excimer laser, a YAG laser or the like.

Figure 5B:
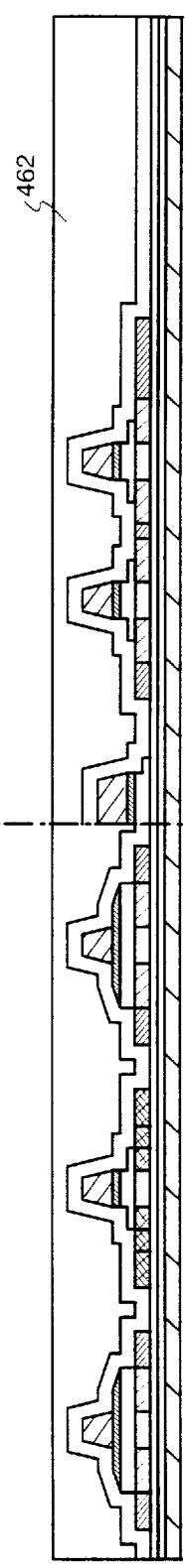

Subsequently, the first interlayer insulating film 461 is overlaid with a second interlayer insulating film 462 which is made of an inorganic insulating material or an organic insulating material (FIG. 5B). In an example, an acrylic resin film having a thickness of 1.6 µm was formed, it had a viscosity of 10 cp–1000 cp, preferably 40 cp–200 cp, and its surface was adapted to be made uneven.

Figure 6A:
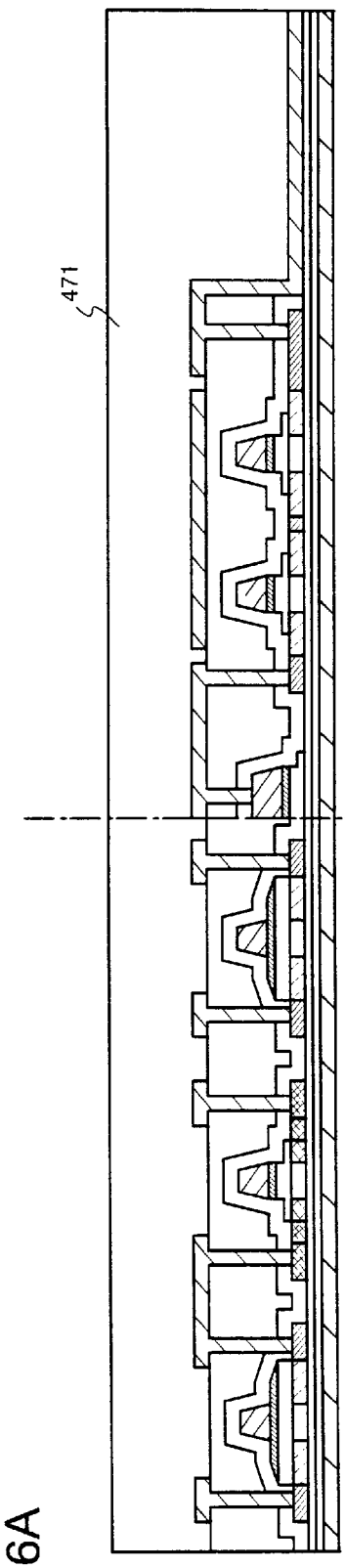
FIGS. 6A and 6B are sectional views showing the fabricating steps of the pixel TFT, and the TFTs of the driver circuit.
Figure 6B:
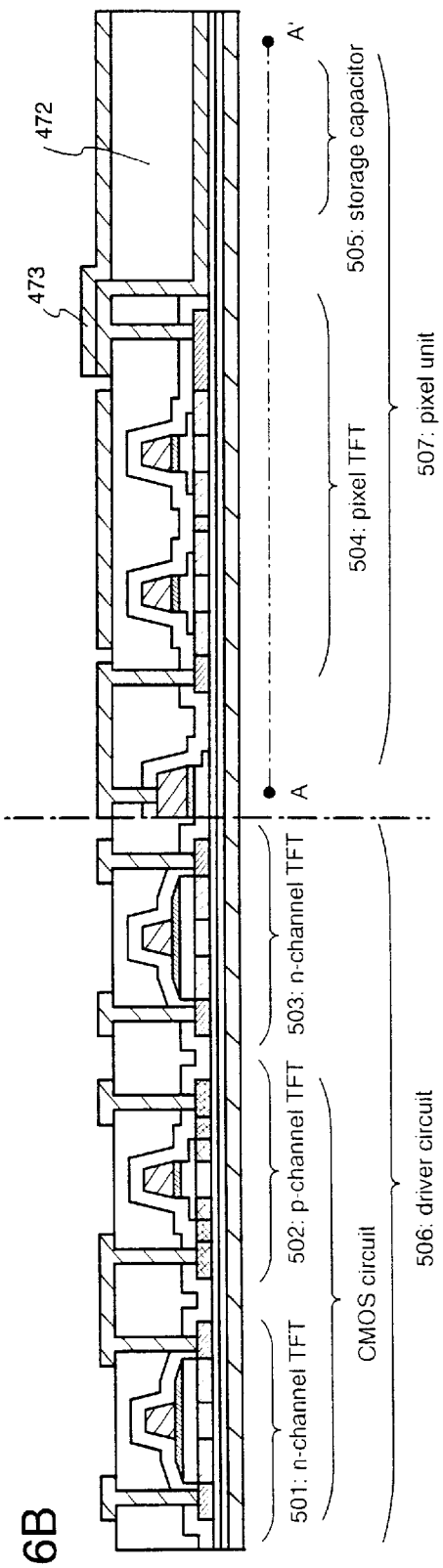

In the example, in order to prevent specular reflection, the second interlayer insulating film 462 whose surface was adapted to be made uneven was formed so as to form uneven parts in the surface of a pixel electrode (473 in FIG. 6B). Alternatively, a convex part may well be formed in any region underlying the pixel electrode, in order that a light scattering property may be attained by bestowing the uneven parts on the surface of the pixel electrode. In that case, the convex part can be formed by the same photo-mask as that for forming the pixel TFT, and hence, without increasing the number of steps. Incidentally, the convex part may be appropriately provided over the substrate part of the pixel unit region except wiring lines and the pixel TFT. In this way, the uneven parts are formed in the surface of the pixel electrode along the uneven parts which are formed in the surface of the insulating film 462 covering the convex part.

Alternatively, a film whose surface is adapted to flatten may well be employed as the second interlayer insulating film 462. In that case, after the formation of the pixel electrode (473), the surface thereof should preferably be made uneven by adding the step of known sand blasting or etching, or the like so as to prevent specular reflection and to scatter reflected light, thereby to heighten the degree of whiteness.

Further, wiring lines 463–467 which are electrically connected with the respectively corresponding impurity regions are formed in a driver circuit 506. Incidentally, these wiring lines are formed by patterning a multilayer film which consists of a Ti film having a thickness of 50 nm, and an alloy film (of Al—Ti alloy) having a thickness of 500 nm.

Figure 5C:
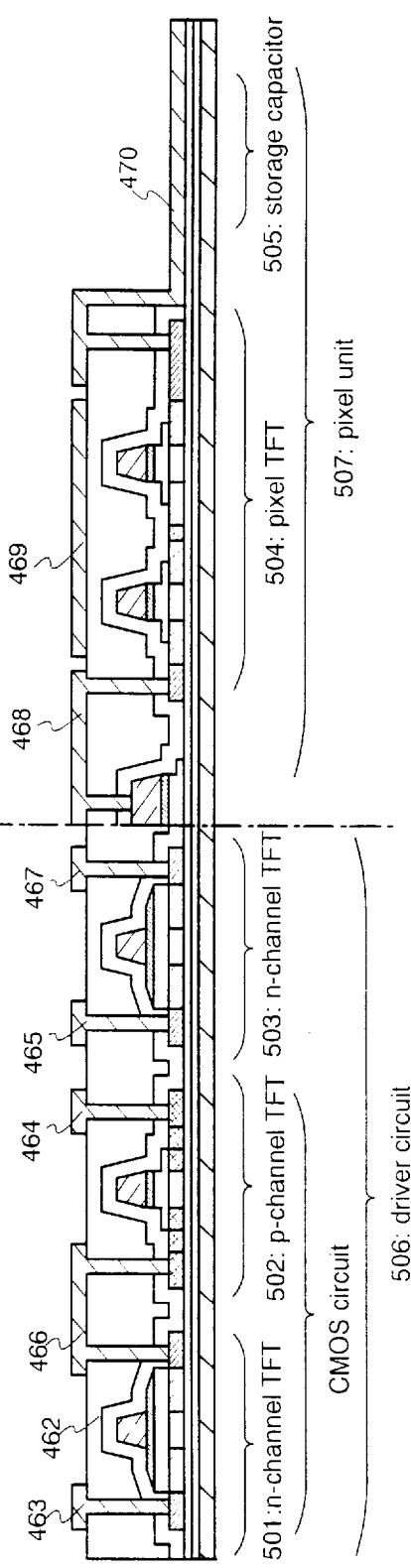

Besides, in the pixel unit 507, at the same time that contact holes which reach a source region and a drain region are formed, the base film 301 is partly exposed in such a way that the first interlayer insulating film 461, the second interlayer insulating film 462 and the gate insulating film 416 are etched in a region which is surrounded with the source wiring line and the drain wiring line to be formed by a later step and which does not overlap the semiconductor layer 405 of the pixel TFT. On this occasion, the area of the region in which the base film 301 is exposed can be properly determined. The larger area of the exposed base film 301 is advantageous for the reason that a wiring line of larger area can be formed, so the storage capacitor constituted by the metal substrate 300, base film 301 and drain wiring line can attain a larger capacity. Subsequently, the drain wiring line 470, a gate wiring line 469 and a connection electrode 468 are formed as shown in FIG. 5C. Owing to the connection electrode 468, the source wiring line (the multilayer structure consisting of the films 436a and 436b) is electrically connected with the pixel TFT 504. Besides, the gate wiring line 469 is electrically connected with the gate electrode of the pixel TFT 504. Also, the drain wiring line 470 is electrically connected with the drain region 426h (FIG. 3C) of the pixel TFT 504, and it further functions as one electrode constituting the storage capacitor 505 (FIG. 5C).

At the next step, a third interlayer insulating film 471 is formed (FIG. 6A). A resin film of low relative permittivity is favorable as the third interlayer insulating film 471. Usable as the resin film is a polyimide film, an acrylic resin film, a polyamide film, a BCB (benzocyclobutene) film or the like. It is also allowed to employ a flattening film as the third interlayer insulating film 471.

Thereafter, the third interlayer insulating film 471 is etched-back into one 472 so as to expose a portion of wiring lines, and the pixel electrode 473 is formed in connection with the drain wiring line 470 of the pixel TFT 504 (FIG. 6B). A metal film of high reflectivity, represented by an aluminum film, may be employed as the pixel electrode 473 in case of manufacturing an AM-LCD of reflection type. The pixel electrode 473 should desirably be formed of a material of excellent reflectivity, for example, a film whose principal component is Al or Ag, or a multilayer film which consists of such films.

In the above way, it is possible to form on the identical substrate 300 the driver circuit 506 which includes a CMOS circuit consisting of the n-channel TFT 501 and the p-channel TFT 502, and the n-channel TFT 503, and the pixel unit 507 which includes the pixel TFT 504 and the storage capacitor 505. Thus, the active matrix substrate is finished up.

The n-channel TFT 501 of the driver circuit 506 includes the channel forming region 423c (FIG. 3C), the lightly-doped impurity regions 423b (LDD regions) which are overlapped by a first conductive layer 428a (FIG. 3C) forming part of the gate electrode, and the heavily-doped impurity regions 423a which function as the source region and drain region. The p-channel TFT 502 which forms the CMOS circuit by being connected with the n-channel TFT 501 through the electrode 466, includes the channel forming region 446d (FIG. 4C), the impurity regions 446b and 446c which are formed outside the gate electrode, and the heavily-doped impurity regions 446a which function as the source region and drain region. Besides, the n-channel TFT 503 includes the channel forming region 425c (FIG. 3C), the lightly-doped impurity regions 425b (LDD regions) which are overlapped by a first conductive layer 430a (FIG. 3C) forming part of the gate electrode, and the heavily-doped impurity regions 425a which function as the source region and drain region.

The pixel TFT 504 of the pixel unit 507 includes the channel forming region 426c (FIG. 3C), the lightly-doped impurity regions 426b (LDD regions) which are formed outside the gate electrode, and the heavily-doped impurity regions 426a and 426h which function as the source region and drain region. Besides, the storage capacitor 505 is formed of the drain wiring line 470 and the metal substrate 300 with the base film 301 utilized as the dielectric.

Besides, in the pixel structure of this embodiment, the end part of each pixel electrode 473 is arranged and formed so as to overlie the source wiring line, in order that the gaps among the pixel electrodes may be shielded from light without employing a black matrix.

Figure 7:
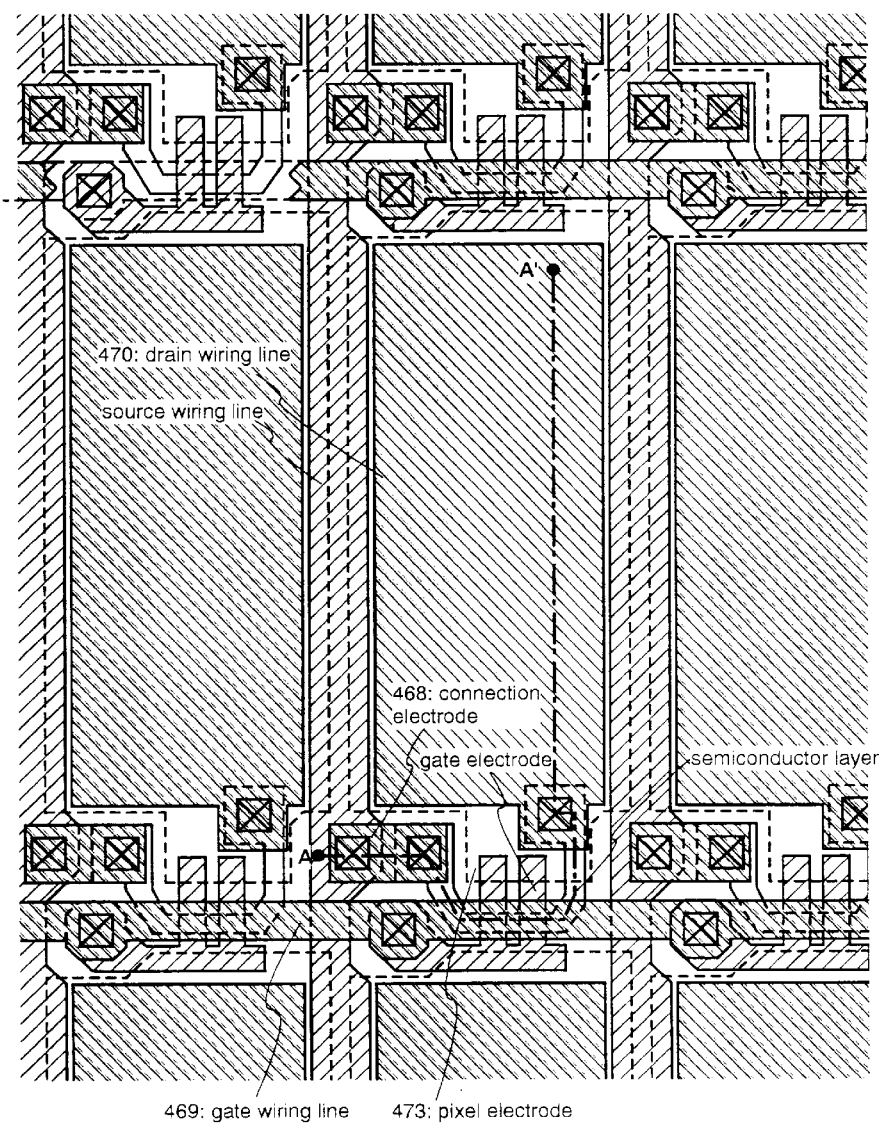
FIG. 7 is a top view showing the construction of a pixel unit.

FIG. 7 shows the top view of the pixel unit of the active matrix substrate which is manufactured in this embodiment. In the figure, parts corresponding to those in FIG. 2A–FIG. 6B are denoted by the same reference numerals. Chain line A–A' in FIGS. 6A and 6B correspond to sections taken along chain line A–A' in FIG. 7.

Incidentally, this embodiment can be combined with Embodiment 1 at will.

[Embodiment 3]

Figure 8:
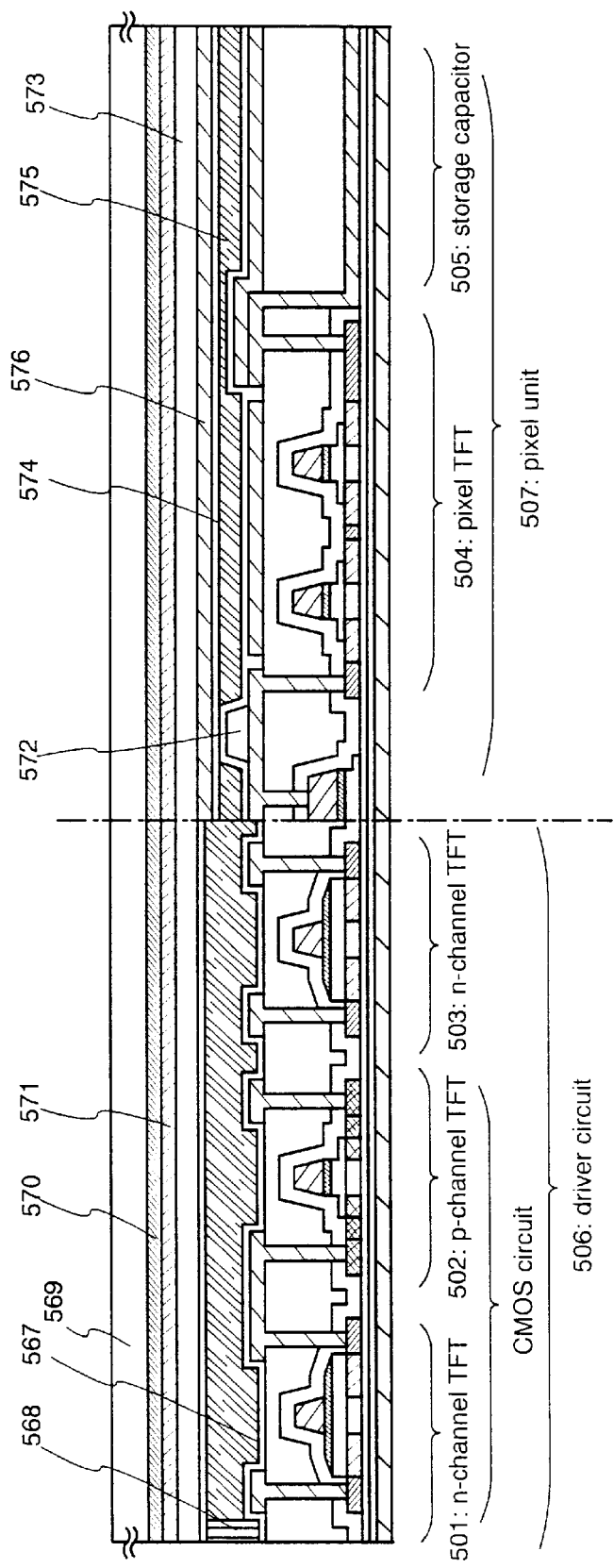
FIG. 8 is a sectional view showing a process for manufacturing a liquid-crystal display device of active matrix type.

In this embodiment, a manufacturing process of a reflection type liquid crystal display device from the active matrix substrate manufactured in accordance with Embodiment 2 will be described hereinbelow. FIG. 8 is used for an explanation thereof.

First, in accordance with Embodiment 2, an active matrix substrate in a state shown in FIG. 6B is obtained, and thereafter, an alignment film 567 is formed on the active matrix substrate of FIG. 6B, at least on the pixel electrode 473, and is subjected to a rubbing process. Note that, in this embodiment, before the formation of the alignment film 567, a spacer 572 for maintaining a gap between the substrates is formed at a desired position by patterning an organic film such as an acrylic resin film. Further, spherical spacers may be scattered on the entire surface of the substrate in place of the columnar like spacer.

Next, an opposing substrate 569 is prepared. The colored layers 570, 571 and a leveling film 573 are formed on the opposing substrate 569. The red-colored layer 570 and the blue-colored layer 572 are partially overlapped with each other, thereby forming a light shielding portion. Note that, the red-colored layer and a green-colored layer are partially overlapped with each other, thereby forming a light shielding portion.

In this embodiment, the substrate shown in Embodiment 2 is used. Accordingly, in FIG. 7 showing a top view of the pixel portion in accordance with Embodiment 2, light shielding must be performed in at least gaps between the gate wiring 469 and the pixel electrodes 473, a gap between the gate wiring 469 and the connection electrode 468, and a gap between the connection electrode 468 and the pixel electrode 473. In this embodiment, the opposing substrate and the active matrix substrate are stuck so that the light shielding portions from laminated layer of colored layer each other overlap with the positions which need to be shielded from light.

Like this, without using a black mask, the gaps between the respective pixels are shielded from light by the light shielding portion. As a result, the reduction of the manufacturing steps can be attained.

Next, the opposing electrode 576 from transparent conductive film is formed on the leveling film 573, at least on the pixel portion. The alignment film 574 on the entire surface of the opposing substrate and the rubbing process is performed.

Then, an active matrix substrate on which a pixel portion and a driver circuit are formed is stuck with the opposing substrate by a sealing agent 568. In the sealing agent 568, a filler is mixed, and the two substrates are stuck with each other while keeping a uniform gap by the effect of this filler and the columnar spacer. Thereafter, a liquid crystal material 575 is injected between both the substrates to encapsulate the substrates completely by an encapsulant (not illustrated). A known liquid crystal material may be used as the liquid crystal material 575. Thus, the reflection type liquid crystal display device shown in FIG. 8 is completed. Then, if necessary, the active matrix substrate or the opposing substrate may be parted into desired shapes. Further, a polarizing plate is adhered to only the opposing substrate (not illustrated). Then, an FPC is adhered using a known technique.

The liquid crystal display device manufactured according to above mentioned way can be used as a display portion of various electronic device.

This embodiment can be combined with the embodiment 1 and 2 freely.

[Embodiment 4]

Here will be described an embodiment in which an EL (Electro Luminescent) display device is manufactured as an example of a light emitting device in accordance with the present invention.

Here in this specification, the "light emitting device" is a general term for a displaying panel in which a light emitting element formed on a substrate is sealed between the substrate and a cover member, and a displaying module in which an IC is mounted on the displaying panel. Incidentally, the light emitting element includes a layer (light emitting layer) which contains an organic compound adapted to luminesce by the application of an electric field, an anode layer, and a cathode layer. Besides, luminescences in organic compounds are classified into light emission (fluorescence) which occurs during the resumption of a singlet-exciton excitation state into a ground state and light emission (phosphorescence) which occurs during the resumption of a triplet-exciton excitation state into a ground state. The light emission of the light emitting element shall include either or both of the fluorescence and the phosphorescence.

Figure 9:
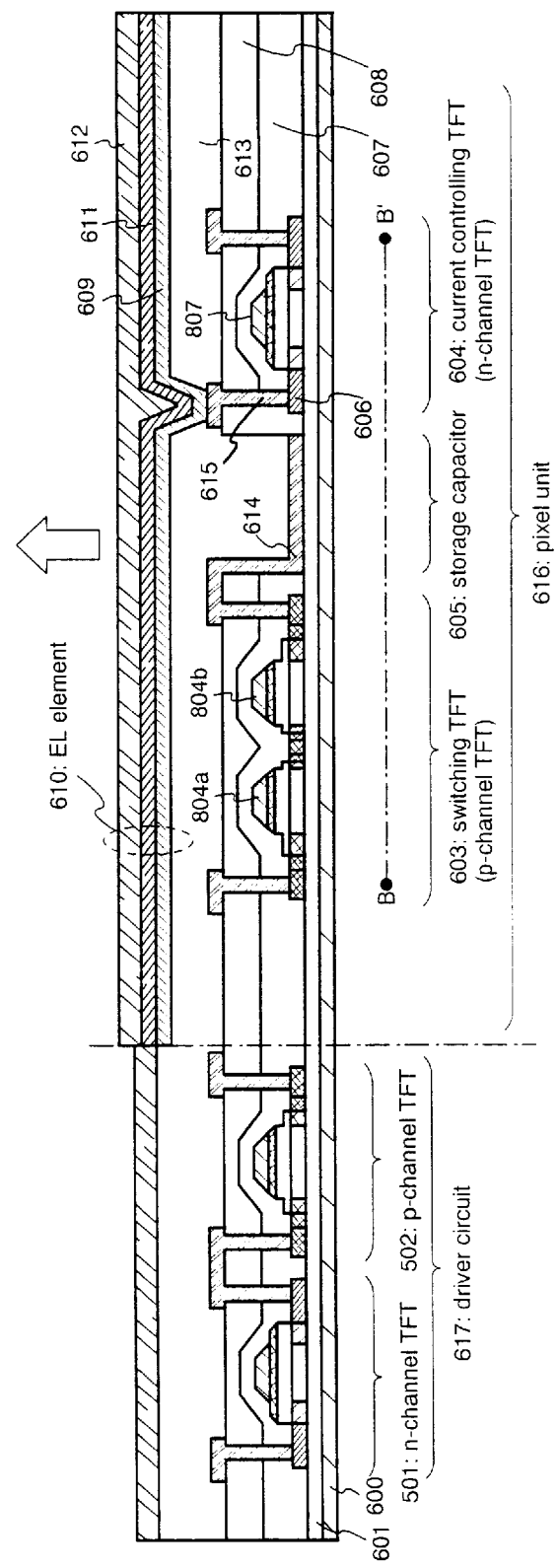
FIG. 9 is a sectional structural view of the driver circuit and pixel unit of an EL display device.

FIG. 9 is a sectional view of the EL display device according to the present invention. That is, FIG. 9 shows the example of the light emitting device (before being sealed) in which a pixel unit, and a driver circuit for driving the pixel unit are formed on an identical insulator. Incidentally, a CMOS circuit being a basic unit is shown in the driver circuit, while one pixel is shown in the pixel unit.

Referring to FIG. 9, numeral 600 designates a metal substrate. An insulating base film 601 provided on the metal substrate 600 is overlaid with the driver circuit 617 constituted by an n-channel TFT 501 and a p-channel TFT 502, a switching TFT 603 formed of a p-channel TFT, and a current controlling TFT 604 formed of an n-channel TFT. In this embodiment, all the TFTs are of top gate type.

Regarding the n-channel TFTs and the p-channel TFTs in FIG. 9, reference may be had to Embodiment 2. Besides, the switching TFT 603 is the p-channel TFT having a structure (double-gate structure) in which two channel forming regions are included between a source region and a drain region. Incidentally, this embodiment is not restricted to the double-gate structure, but it may well employ a single-gate structure in which one channel forming region is formed, or a triple-gate structure in which three channel forming regions are formed. Besides, the current controlling TFT 604 is the n-channel TFT of the single-gate structure. Incidentally, although the n-channel TFT 604 has the single-gate structure in this embodiment, it may well have the double-gate structure or the triple-gate structure.

The drain region of the switching TFT 603 is connected with the gate electrode of the current controlling TFT 604 (though no illustration is made). Simultaneously, a first interlayer insulating film 607 and a second interlayer insulating film 608 are etched to partly expose the insulating base film 601. On this occasion, the area of a region in which the insulating base film 601 is exposed can be properly determined. The larger area of the exposed insulating base film 601 is advantageous for the reason that a wiring line of larger area can be formed, so a storage capacitor 605 constituted by the metal substrate 600, insulating base film 601 and a drain wiring line 614 can attain a larger capacity. Further, it is advantageous for the attainment of the larger capacity of the storage capacitor 605 that, in etching the first interlayer insulating film 607 and the second interlayer insulating film 608, the insulating base film 601 is etched to become thinner. Besides, source wiring lines and drain wiring lines are formed to fabricate the TFTs. In the pixel unit 616, the drain wiring line 614 is formed which connects the drain region and the exposed region of the insulating base film 601.

At the next step, a third interlayer insulating film 613 is formed. A flattening film made of, for example, a resin is employed as the third interlayer insulating film 613. It is very important that stepped parts ascribable to the TFTs and the storage capacitor are flattened by employing the flattening film. Since an EL layer 611 to be formed later is very thin, it sometimes fails to emit light due to the existence of the stepped parts. Accordingly, the resulting structure should desirably be flattened before the formation of a pixel electrode 609 so that the EL layer 611 can be flattened to the utmost.

Subsequently, the pixel electrode 609 connected with the drain wiring line 615, which is connected with a drain region 606, is provided. The pixel electrode 609 is an electrode which functions as the cathode of the EL element 610, and it is formed of a conductive film which contains an element belonging to Group-1 or -2 of the periodic table. In an example, the pixel electrode 609 was formed of a conductive film made of a compound of lithium and aluminum.

Besides, the EL element 610 is constituted by the pixel electrode (cathode) 609, the EL layer 611 and an anode 612. The anode 612 is formed of a conductive film of large work function, typically an oxide conductive film. Indium oxide, tin oxide, zinc oxide or the like compound may be employed for the oxide conductive film.

Here in this specification, stacked layers in which a hole injecting layer, a hole transporting layer, a hole blocking layer, an electron transporting layer, an electron injecting layer or an electron blocking layer is combined with a light emitting layer (EL film) is generically defined as an "EL layer". The "EL layer", however, shall comprehend also a case of employing the EL film as a single layer.

Besides, although the light emitting layer 611 is not especially restricted as regards an EL material, it can be formed of, for example, a thin film which is made of a light emitting material emitting light on the basis of doublet-exciton excitation, or a thin film which is made of a light emitting material emitting light on the basis of triplet-exciton excitation.

Although no illustration is made here, it is effective that, after the formation of the anode 612, a passivation film is provided so as to entirely cover the EL element 610. The passivation film is formed of the single-layer structure of a carbon film, a silicon nitride film or a silicon nitroxide film, or the multilayer structure of such insulating films combined.

Figure 10A:
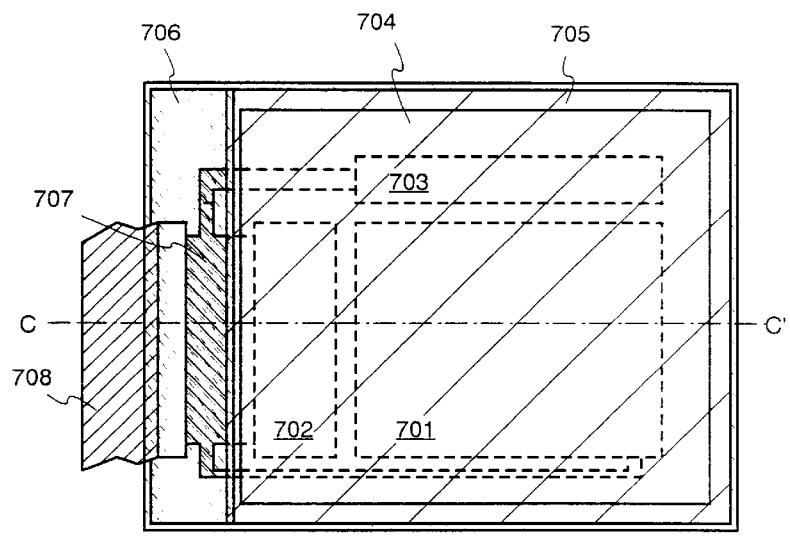
Figure 10B:
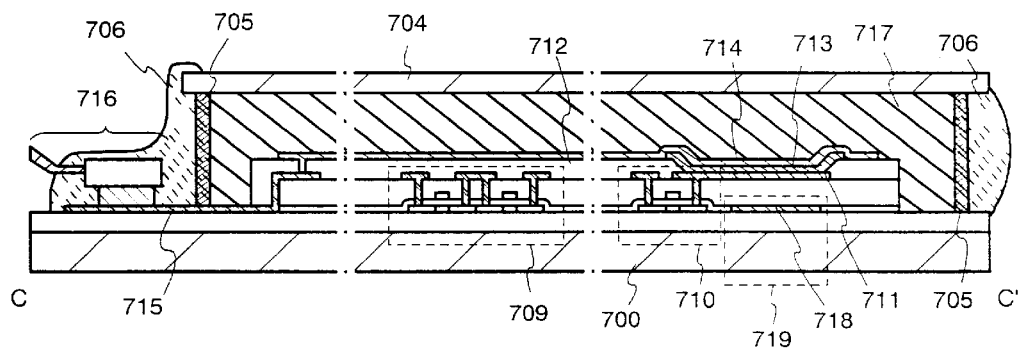
FIG. 10B is a sectional structural view of the driver circuit and pixel unit of the EL display device.

Next, the EL display device which has been subjected to a sealing (or encapsulating) step for protecting the EL element will be described with reference to FIGS. 10A and 10B. FIG. 10A is a top view showing a state where the EL element has been sealed, while FIG. 10B is a sectional view taken along plane C–C' in FIG. 10A. A part 701 enclosed with a dotted line is the pixel unit, a part 702 is a source side driver circuit, and a part 703 is a gate side driver circuit. Besides, numeral 704 designates a cover member, numeral 705 a first sealing member, and numeral 706 a second sealing member.

Incidentally, numeral 707 indicates wiring lines for transferring signals which are to be inputted to the source side driver circuit 702 and the gate side driver circuit 703. The wiring lines 707 receive a video signal and a clock signal from an FPC (flexible printed circuit) 708 which serves as external input terminals. Incidentally, although only the FPC 708 is shown here, it may well be furnished with a printed-wiring board (PWB).

The sectional structure of the EL display device will be explained with reference to FIG. 10B. An insulator 700 (which corresponds to the element forming substrate 600) is overlaid with the pixel unit and the source side driver circuit 709. The pixel unit is formed of a plurality of pixels which include the current controlling TFT 710, and the pixel electrode 711 electrically connected to the drain of the TFT 710. Besides, the storage capacitor is formed of part 718 of the drain wiring line of the switching TFT, the insulating base film, and the stainless steel substrate 700. Further, the source side driver circuit 709 is formed of a CMOS circuit in which an n-channel TFT and a p-channel TFT are combined.

The third interlayer insulating film 712 is formed at both the ends of the pixel electrode 711, and the EL layer 713 and anode 714 of the EL element are formed on the pixel electrode 711. The anode 714 functions also as a wiring line common to all the pixels of the pixel unit, and it is electrically connected to the FPC 716 via a connection wiring line 715. Further, all the elements included in the pixel unit and the source side driver circuit 709 are covered with the passivation film (not shown).

The cover member 704 is unitarily stuck by the first sealing member 705. Incidentally, a spacer may well be disposed in order to ensure the spacing between the cover member 704 and the EL element. Besides, a vacancy 717 is formed inside the first sealing member 705. By the way, the first sealing member 705 should desirably be made of a material which does not transmit moisture and oxygen. Further, it is effective that a substance having a hygroscopic effect, or a substance having an antioxidant effect is disposed within the vacancy 717.

Incidentally, a carbon film (concretely, a diamond-like carbon film) may be provided as a protective film on each of the front surface and rear surface of the cover member 704 to a thickness of 2 nm–30 nm. Such a carbon film (not shown here) serves to prevent the invasion of oxygen as well as water, and also to mechanically protect the front surface of the cover member 704. Besides, a polarization plate (typically, a circular polarization plate) may well be stuck onto the cover member 704.

After the cover member 704 has been bonded, the second sealing member 706 is disposed so as to cover the exposed surface of the first sealing member 705. The second sealing member 706 can be made of the same material as that of the first sealing member 705.

When the EL element has been sealed by the structure as stated above, it can be completely shut off from outside, and the substance, such as moisture or oxygen, which accelerates the deterioration of the EL element due to the oxidation of the EL layer can be prevented from invading the EL element from outside. Accordingly, the EL display device of high reliability can be obtained.

Incidentally, this embodiment can be combined with any of Embodiments 1 through 3 at will.

[Embodiment 5]

Figure 11:
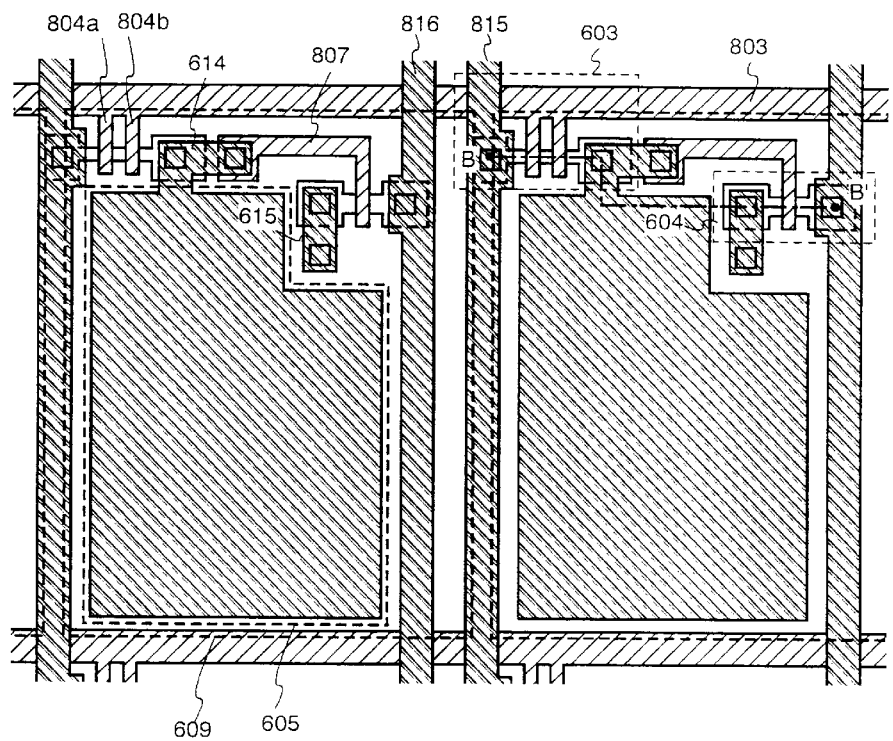
FIG. 11 is a top view of the pixel unit of the EL display device.

In this embodiment, a more detailed top structure of the pixel unit in the EL display device obtained in Embodiment 4 will be described with reference to FIG. 11. Incidentally, the same reference numerals are assigned to parts corresponding to those in FIG. 9. Chain line B–B' in FIG. 9 corresponds to a section taken along chain line B–B' in FIG. 11.

The source of the switching TFT 603 is connected to a source wiring line 815, and the drain thereof to a drain wiring line 614. Besides, the drain wiring line 614 is electrically connected to the gate electrode 807 of the current controlling TFT 604. Besides, the source of the current controlling TFT 604 is electrically connected to a current feed line 816, and the drain thereof to the drain wiring line 615. Also, the drain wiring line 615 is electrically connected to the pixel electrode (cathode) 609 indicated by a dotted line. Reference numeral 803 denotes a gate wiring line and 804a and 804b denote gate electrodes.

On this occasion, the storage capacitor is formed in a region indicated by numeral 605. That is, the storage capacitor 605 is formed of the drain wiring line 614, the insulating base film (not shown) and the metal substrate (not shown).

Incidentally, this embodiment can be combined with any of Embodiments 1 through 3 at will.

[Embodiment 6]

TFT in accordance with the above mentioned embodiment 1 to 5 can be used in various electro-optical devices (active matrix type liquid crystal display, active matrix type EL display and active matrix type EC display). In other words, the present invention can be applied to all of the electronic equipments having these electro-optical devices as the display section.

The following can be given as examples of the electronic equipment: video cameras; digital cameras; head mounted displays (goggle type display); car navigation systems; car stereo; personal computers; portable information terminals (such as mobile computers, portable telephones and electronic notebook). An example of these is shown in FIGS. 12 and 13.

Figure 12A:
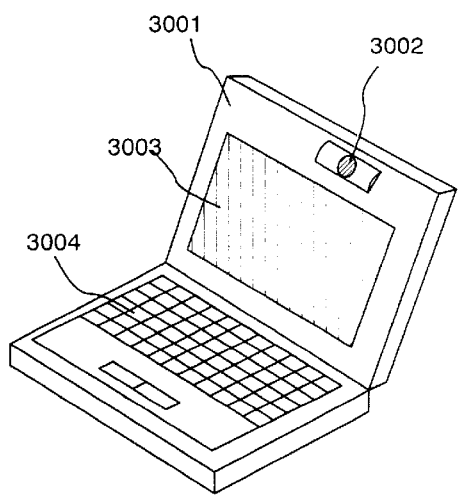
FIGS. 12A through 12F are perspective views each showing an example of electronic equipment.

FIG. 12A shows a personal computer, and it includes a main body 3001, an image input section 3002, a display portion 3003, and a keyboard 3004. The present invention is applicable to the display portion 3003.

Figure 12B:
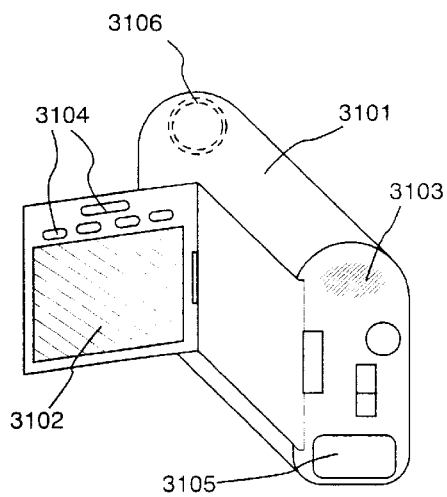

FIG. 12B shows a video camera, and it includes a main body 3101, a display portion 3102, a voice input section 3103, operation switches 3104, a battery 3105, and an image receiving section 3106. The present invention is applicable to the display portion 3102.

Figure 12C:
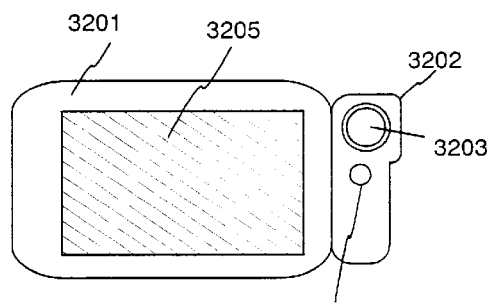

FIG. 12C shows a mobile computer, and it includes a main body 3201, a camera section 3202, an image receiving section 3203, operation switches 3204, and a display portion 3205. The present invention is applicable to the display portion 3205.

Figure 12D:
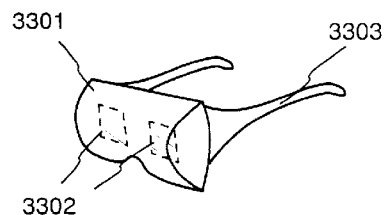

FIG. 12D shows a goggle type display, and it includes a main body 3301; a display portion 3302; and an arm section 3303. The present invention is applicable to the display portion 3302.

Figure 12E:
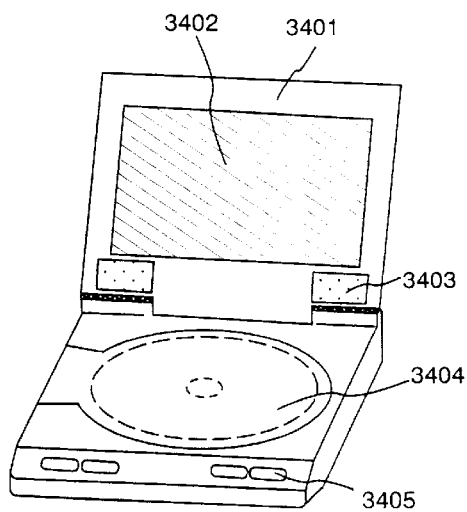

FIG. 12E shows a player using a recording medium which records a program (hereinafter referred to as a recording medium), and it includes a main body 3401; a display portion 3402; a speaker section 3403; a recording medium 3404; and operation switches 3405. This player uses DVD (digital versatile disc), CD, etc. for the recording medium, and can be used for music appreciation, film appreciation, games and Internet. The present invention is applicable to the display portion 3402.

Figure 12F:
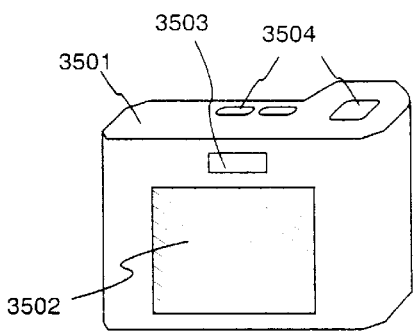

FIG. 12F shows a digital camera, and it includes a main body 3501; a display portion 3502; a view finder 3503; operation switches 3504; and an image receiving section (not shown in the figure). The present invention can be applied to the display portion 3502.

Figure 13A:
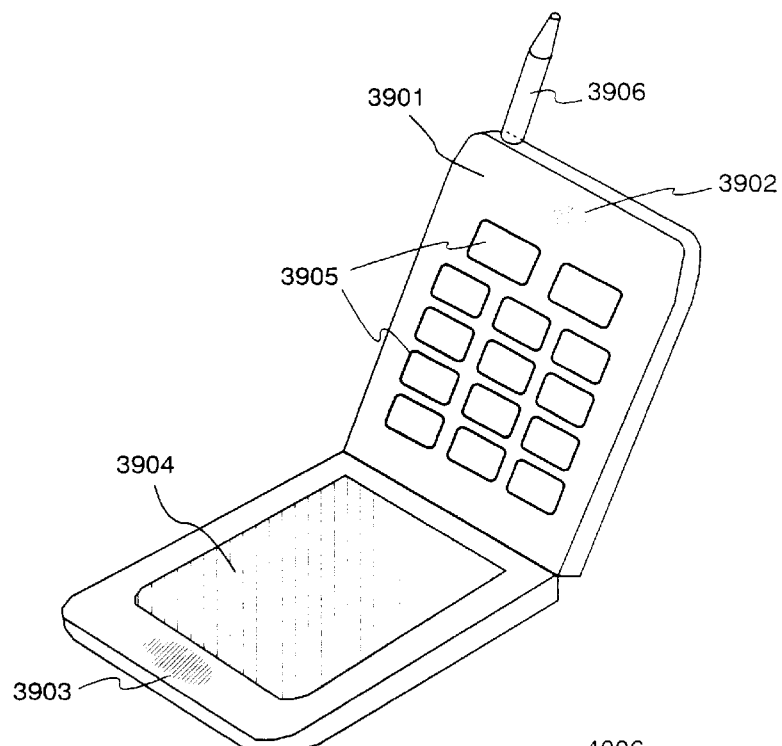
FIGS. 13A through 13C are perspective views each showing an example of electronic equipment.

FIG. 13A shows a portable telephone, and it includes a main body 3901, an audio output section 3902, an audio input section 3903, a display portion 3904, operation switches 3905, and an antenna 3906. The present invention can be applied to the display portion 3904.

Figure 13B:
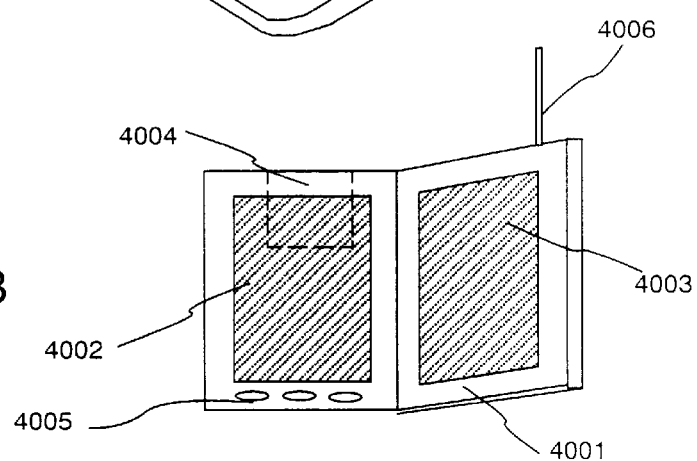

FIG. 13B shows a portable book (electronic book), and it includes a main body 4001, display portions 4002 and 4003, a recording medium 4004, operation switches 4005, and an antenna 4006. The present invention can be applied to the display portions 4002 and 4003.

Figure 13C:
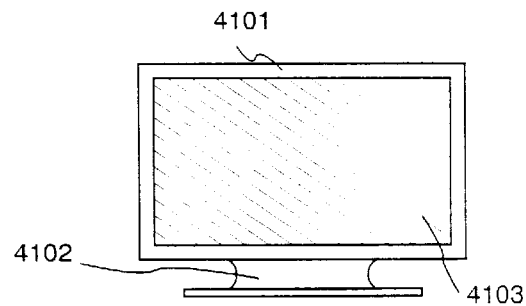

FIG. 13C shows a display, and it includes a main body 4101, a support stand 4102, and a display portion 4103. The present invention can be applied to the display portion 4103. The display of the present invention is advantageous for a large size screen in particular, and is advantageous for a display equal to or greater than 10 inches (especially equal to or greater than 30 inches) in diagonal.

The applicable range of the present invention is thus extremely wide, and it is possible to apply the present invention to electronic equipment in all fields. Especially, it is applicable to the electronic equipment demanded for a lightened. Further, the electronic equipment of the embodiment 10 can be realized by using a constitution of any combination of the embodiments 1 to 5.

The following fundamental significances can be attained by adopting the construction of the present invention:

(a) A semiconductor device according to the present invention has a simple structure which is suited to a conventional process for fabricating TFTs.

(b) A storage capacitor is formed of a substrate having a metal surface, an insulating film, and a wiring line. In this regard, the capacity of the storage capacitor can be properly altered by the insulating base film which functions as a dielectric. Concretely, the capacity of the storage capacitor can be altered by the thickness of the insulating base film, and that area of the insulating base film which is exposed by etching.

(c) A method according to the present invention is a method which can manufacture a favorable semiconductor device with the above advantages satisfied. Moreover, on condition that the substrate having the metal surface is thin, a semiconductor device having a flexibility and being lighter in weight can be obtained.

What is claimed is:

1. A semiconductor device comprising:
a substrate having a metal surface;
a base insulating film formed in contact with said substrate having said metal surface;
a pixel unit formed over said base insulating film, said pixel unit comprising a thin film transistor having at least a semiconductor layer and a gate electrode with a gate insulating film interposed therebetween;
a first insulating film covering said gate electrode and said semiconductor layer;
a portion of said first insulating film is removed so as to expose a portion of said base insulating film;
a metal wiring formed on said portion of said base insulating film and electrically connected to said semiconductor layer; and
a storage capacitor comprising a portion of said substrate having said metal surface, said portion of said base insulating film, and said metal wiring.

2. A semiconductor device according to claim 1, wherein said metal surface of said substrate has a maximum roughness of 1 μm or less.

3. A semiconductor device according to claim 1, wherein a radius of curvature of a convex part existing in said metal surface of said substrate is 1 μm or more.

4. A semiconductor device according to claim 1, wherein said substrate comprises a stainless steel substrate.

5. A semiconductor device according to claim 1, wherein said semiconductor device is a liquid crystal display device.

6. A semiconductor device according to claim 1, wherein said semiconductor device is at least one selected from the group consisting of a portable telephone, a video camera, a digital camera, a goggle type display, a personal computer, a DVD player, an electronic book, a mobile computer, and a portable information terminal.

7. A semiconductor device comprising:
a substrate having a metal surface;
a base insulating film formed in contact with said substrate having said metal surface;
a pixel unit formed over said base insulating film, said pixel unit comprising a thin film transistor having at least a semiconductor layer and a gate electrode with a gate insulating film interposed therebetween;
a first insulating film covering said gate electrode and said semiconductor layer;
a portion of said first insulating film is removed so as to expose a portion of said base insulating film;
a metal wiring formed on said portion of said base insulating film and electrically connected to said semiconductor layer;
a pixel electrode electrically connected to said metal wiring; and
a storage capacitor comprising a portion of said substrate having said metal surface, said portion of said base insulating film, and said metal wiring.

8. A semiconductor device according to claim 7, wherein said metal surface of said substrate has a maximum roughness of 1 $\mu$m or less.

9. A semiconductor device according to claim 7, wherein a radius of curvature of a convex part existing in said metal surface of said substrate is 1 $\mu$m or more.

10. A semiconductor device according to claim 7, wherein said substrate comprises a stainless steel substrate.

11. A semiconductor device according to claim 7, wherein said semiconductor device is a liquid crystal display device.

12. A semiconductor device according to claim 7, wherein said semiconductor device is at least one selected from the group consisting of a portable telephone, a video camera, a digital camera, a goggle type display, a personal computer, a DVD player, an electronic book, a mobile computer, and a portable information terminal.

13. A semiconductor device comprising:
a substrate having a metal surface;
a base insulating film formed in contact with said substrate having said metal surface;
a pixel unit formed over said first insulating film, said pixel unit comprising a thin film transistor having at least a semiconductor layer and a gate electrode with a gate insulating film interposed therebetween;
a first insulating film covering said gate electrode and said semiconductor layer;
a portion of said first insulating film is removed so as to expose a portion of said base insulating film;
a metal wiring formed on said portion of said base insulating film and electrically connected to said semiconductor layer;
a second insulating film formed on said metal wiring;
a pixel electrode formed on said second insulating film and electrically connected to said metal wiring; and
a storage capacitor comprising a portion of said substrate having said metal surface, said portion of said base insulating film, and said metal wiring.

14. A semiconductor device according to claim 13, wherein said metal surface of said substrate has a maximum roughness of 1 $\mu$m or less.

15. A semiconductor device according to claim 13, wherein a radius of curvature of a convex part existing in said metal surface of said substrate is 1 $\mu$m or more.

16. A semiconductor device according to claim 13, wherein said substrate comprises a stainless steel substrate.

17. A semiconductor device according to claim 13, wherein said semiconductor device is a liquid crystal display device.

18. A semiconductor device according to claim 13, wherein said semiconductor device is at least one selected from the group consisting of a portable telephone, a video camera, a digital camera, a goggle type display, a personal computer, a DVD player, an electronic book, a mobile computer, and a portable information terminal.

19. A semiconductor device according to claim 13, wherein said second insulating film comprises one selected from the group consisting of a polyimide film, an acrylic resin, a polyamide film, and a BCB (benzocyclobutene) film.

20. A semiconductor device comprising:
a metal substrate;
a base insulating film formed in contact with said metal substrate;
a pixel unit formed over said base insulating film, said pixel unit comprising a thin film transistor having at least a semiconductor layer and a gate electrode with a gate insulating film interposed therebetween;
a first insulating film covering said gate electrode and said semiconductor layer;
a portion of said first insulating film is removed so as to expose a portion of said base insulating film;
a metal wiring formed on said portion of said base insulating film and electrically connected to said semiconductor layer; and
a storage capacitor comprising a portion of said metal substrate, said portion of said base insulating film, and said metal wiring.

21. A semiconductor device according to claim 19, wherein a surface of said metal substrate has a maximum roughness of 1 $\mu$m or less.

22. A semiconductor device according to claim 19, wherein a radius of curvature of a convex part existing in a metal surface of said metal substrate is 1 $\mu$m or more.

23. A semiconductor device according to claim 19, wherein said metal substrate comprises a stainless steel substrate.

24. A semiconductor device according to claim 19, wherein said semiconductor device is a liquid crystal display device.

25. A semiconductor device according to claim 19, wherein said semiconductor device is at least one selected from the group consisting of a portable telephone, a video camera, a digital camera, a goggle type display, a personal computer, a DVD player, an electronic book, a mobile computer, and a portable information terminal.

26. A semiconductor device comprising:
a metal substrate;
a base insulating film formed in contact with said metal substrate;
a pixel unit formed over said base insulating film, said pixel unit comprising a thin film transistor having at least a semiconductor layer and a gate electrode with a gate insulating film interposed therebetween;
a first insulating film covering said gate electrode and said semiconductor layer;
a portion of said first insulating film is removed so as to expose a portion of said base insulating film;
a metal wiring formed on said portion of said base insulating film and electrically connected to said semiconductor layer;
a pixel electrode electrically connected to said metal wiring; and a storage capacitor comprising a portion of said metal substrate, said portion of said base insulating film, and said metal wiring.

27. A semiconductor device according to claim 26, wherein a surface of said metal substrate has a maximum roughness of 1 µm or less.

28. A semiconductor device according to claim 26, wherein a radius of curvature of a convex part existing in a metal surface of said metal substrate is 1 µm or more.

29. A semiconductor device according to claim 26, wherein said metal substrate comprises a stainless steel substrate.

30. A semiconductor device according to claim 26, wherein said semiconductor device is a liquid crystal display device.

31. A semiconductor device according to claim 26, wherein said semiconductor device is at least one selected from the group consisting of a portable telephone, a video camera, a digital camera, a goggle type display, a personal computer, a DVD player, an electronic book, a mobile computer, and a portable information terminal.

32. A semiconductor device comprising:

a metal substrate;

a base insulating film formed in contact with said metal substrate;

a pixel unit formed over said base insulating film, said pixel unit comprising a thin film transistor having at least a semiconductor layer and a gate electrode with a gate insulating film interposed therebetween;

a first insulating film covering said gate electrode and said semiconductor layer;

a portion of said first insulating film is removed so as to expose a portion of said base insulating film;

a metal wiring formed on said portion of said base insulating film and electrically connected to said semiconductor layer;

a second insulating film formed on said metal wiring;

a pixel electrode formed on said second insulating film and electrically connected to said metal wiring; and a storage capacitor comprising a portion of said metal substrate, said portion of said base insulating film, and said metal wiring.

33. A semiconductor device according to claim 32, wherein a surface of said metal substrate has a maximum roughness of 1 µm or less.

34. A semiconductor device according to claim 32, wherein a radius of curvature of a convex part existing in a metal surface of said metal substrate is 1 µm or more.

35. A semiconductor device according to claim 32, wherein said metal substrate comprises a stainless steel substrate.

36. A semiconductor device according to claim 32, wherein said semiconductor device is a liquid crystal display device.

37. A semiconductor device according to claim 32, wherein said semiconductor device is at least one selected from the group consisting of a portable telephone, a video camera, a digital camera, a goggle type display, a personal computer, a DVD player, an electronic book, a mobile computer, and a portable information terminal.

38. A semiconductor device according to claim 32, wherein said second insulating film comprises one selected from the group consisting of a polyimide film, an acrylic resin, a polyamide film, and a BCB (benzocyclobutene) film.

* * * * *